United States Patent
Axmon et al.

(10) Patent No.: US 10,291,260 B2
(45) Date of Patent: *May 14, 2019

(54) DECODING OF MESSAGES

(71) Applicant: Telefonaktiebolaget LM Ericsson (publ), Stockholm (SE)

(72) Inventors: Joakim Axmon, Limhamn (SE); Bengt Lindoff, Bjärred (SE); Anders Wallén, Ystad (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/562,289

(22) PCT Filed: Apr. 21, 2016

(86) PCT No.: PCT/EP2016/058903
§ 371 (c)(1),
(2) Date: Sep. 27, 2017

(87) PCT Pub. No.: WO2016/173922
PCT Pub. Date: Nov. 3, 2016

(65) Prior Publication Data
US 2018/0241416 A1    Aug. 23, 2018

Related U.S. Application Data

(60) Provisional application No. 62/154,846, filed on Apr. 30, 2015.

(51) Int. Cl.
*H03M 13/00* (2006.01)
*H03M 13/29* (2006.01)
(Continued)

(52) U.S. Cl.
CPC ..... *H03M 13/2906* (2013.01); *H03M 13/036* (2013.01); *H03M 13/09* (2013.01);
(Continued)

(58) Field of Classification Search
None
See application file for complete search history.

(56) References Cited

U.S. PATENT DOCUMENTS 5,392,231 A * 2/1995 Takahashi ............... G06T 9/004
704/E19.02
6,356,661 B1 * 3/2002 Wen ....................... H04N 19/89
375/E7.222

(Continued)

FOREIGN PATENT DOCUMENTS

| EP | 1811674 A1 | 7/2007 |
| EP | 1811711 A1 | 7/2007 |
| WO | 2011032107 A1 | 3/2011 |

OTHER PUBLICATIONS

Ericsson, "PBCH repetition for MTC", 3GPP TSG-RAN WG1 Meeting #80bis, Apr. 20-24, 2015, pp. 1-4, Belgrade, Serbia, R1-152190.

(Continued)

*Primary Examiner* — Mujtaba M Chaudry
(74) *Attorney, Agent, or Firm* — Coats & Bennett, PLLC

(57) ABSTRACT

Decoding of a first message is disclosed, wherein first and second messages are encoded by a code (represented by a state machine) to produce first and second code words, which are received over a communication channel. A plurality of differences (each corresponding to a hypothesized value of a part of the first message) between the first and second messages are hypothesized. An initial code word segment is selected having, as associated previous states, a plurality of initial states (each associated with a hypothesized difference and uniquely defined by the hypothesized (Continued)

value of the part of the first message). The first message is decoded by (for each code word segment, starting with the initial code word segment): combining the code word segment of the first code word with a transformed (based on the hypothesized difference of the initial state associated with the previous state of the state transition corresponding to a first message segment content) code word segment of the second code word to produce a combined code word segment, determining a decision metric associated with a probability that the combined code word segment corresponds to the first message segment content, and selecting (for the first message) the first message segment content or a second message segment content based on the decision metric. If the first message segment content is selected, the subsequent state of the state transition corresponding to the first message segment content is associated with the initial state associated with the previous state of the state transition.

42 Claims, 12 Drawing Sheets

(51) Int. Cl.
| | | |
|---|---|---|
| *H03M 13/09* | (2006.01) | |
| *H03M 13/41* | (2006.01) | |
| *H04L 1/00* | (2006.01) | |
| *H03M 13/03* | (2006.01) | |
| *H04L 1/08* | (2006.01) | |

(52) U.S. Cl.
   CPC ......... *H03M 13/093* (2013.01); *H03M 13/41* (2013.01); *H03M 13/413* (2013.01); *H04L 1/0045* (2013.01); *H04L 1/0054* (2013.01); *H04L 1/0072* (2013.01); *H04L 1/08* (2013.01)

(56) References Cited

U.S. PATENT DOCUMENTS

| | | | | |
|---|---|---|---|---|
| 2007/0140164 | A1 | 6/2007 | Zeng et al. | |
| 2008/0279312 | A1* | 11/2008 | Stewart | H03M 13/3769 375/340 |
| 2009/0207818 | A1* | 8/2009 | Tsai | H04L 1/0052 370/338 |
| 2010/0074448 | A1* | 3/2010 | Park | H04J 13/00 380/287 |
| 2011/0228883 | A1 | 9/2011 | Liu et al. | |
| 2014/0126768 | A1* | 5/2014 | Ramachandran | G06K 9/00711 382/103 |
| 2016/0165626 | A1* | 6/2016 | Finne | H04W 72/1278 370/336 |
| 2017/0147928 | A1* | 5/2017 | Vijayendra | G06N 5/04 |

OTHER PUBLICATIONS

3rd Generation Partnership Project, "Technical Specification Group Radio Access Network; Evolved Universal Terrestrial Radio Access (E-UTRA); Physical channels and modulation (Release 12)", 3GPP TS 36.211 V12.4.0, Dec. 2014, pp. 1-124.
Ericsson, "PBCH repetition for MTC", 3GPP TSG-RAN WG1 Meeting #80bis, Apr. 20-24, 2015, pp. 1-3, Belgrade, Serbia, R1-151223.
3rd Generation Partnership Project, "Technical Specification Group Radio Access Network; Evolved Universal Terrestrial Radio Access (E-UTRA); User Equipment (UE) procedures in idle mode (Release 12)", 3GPP TS 36.304 V12.3.0, Dec. 2014, pp. 1-37.
3rd Generation Partnership Project, "Technical Specification Group Radio Access Network; Evolved Universal Terrestrial Radio Access (E-UTRA); Multiplexing and channel coding (Release 12)", 3GPP TS 36.212 V12.3.0, Dec. 2014, pp. 1-89.
3rd Generation Partnership Project, "Technical Specification Group Radio Access Network; Evolved Universal Terrestrial Radio Access (E-UTRA); Radio Resource Control (RRC); Protocol specification (Release 12)", 3GPP TS 36.331 V124.1, Dec. 2014, pp. 1-410.
3rd Generation Partnership Project, "Technical Specification Group Radio Access Network; Study on provision of low-cost Machine-Type Communications (MTC) User Equipments (UEs) based on LTE (Release 12)", 3GPP TR 36.888 V12.0.0, Jun. 2013, pp. 1-55.
Vodafone, "New WI: Low cost & enhanced coverage MTC UE for LTE", 3GPP TSG RAN meeting #60, Jun. 10-14, 2013, pp. 1-7, Oranjestad, Aruba, RP-130848.
Ericsson, "PBCH repetition for MTC", 3GPP TSG-RAN WG1 Meeting #80, Feb. 9-13, 2015, pp. 1-4, Athens, Greece, R1-150229.
LG Electronics et al., "WF on PBCH Repetition for Coverage Enhancements of MTC", 3GPP TSG RAN WG1 #79, Nov. 17-21, 2014, pp. 1-5, San Francisco, US, R1-145400.
Vodafone, "New WI: Low cost & enhanced coverage MTC UE for LTE", 3GPP TSG RAN meeting #60, Jun. 10-14, 2013, pp. 1-5, Oranjestad, Aruba, RP-130848.
Forney, Jr., G., "The Viterbi Algorithm", Proceedings of the IEEE, Mar. 1973, pp. 268-278, vol. 61, No. 3.
Harvey, B. et al., "Packet Combining Systems Based on the Viterbi Decoder", Military Communications Conference—Fusing Command, Control and Intelligence, Oct. 11-14, 1992, pp. 757-762, San Diego, US.

* cited by examiner

DECODING OF MESSAGES

TECHNICAL FIELD

The present disclosure relates generally to the field of decoding. More particularly, it relates to decoding of messages with known or hypothesized difference.

BACKGROUND

Particular examples and scenarios will be given herein where some embodiments may be applicable. It should be understood, however, that some embodiments may be equally applicable in relation to other examples and scenarios.

Machine Type Communication in Enhanced Coverage

There is a current work item in 3GPP (Third Generation Partnership Project) on "Low cost & enhanced coverage MTC UE for LTE" (3GPP RP-130848). One objective of the work item aims at significantly improving the coverage for Machine Type Communication (MTC) devices for LTE. One goal of the work item is to improve the support of such devices in poor radio conditions; devices that typically have low data rate requirements and are delay tolerant. A typical use case could be utility meters in basements. The actual required improvement compared to a legacy UMTS LTE (Universal Mobile Telecommunication System, Long Term Evolution) system is different for different physical channels, but is in the order of 15 dB (relating to signal levels and also to signal-to-interference-and-noise ratio—SINR). This is in most cases achieved by different forms of repetition, such that a message e.g. is transmitted over several 1 ms subframes instead of the single subframe transmission that is normally used. Some information transmitted over certain physical channels is repeated already in legacy LTE systems. Most notably, this refers to the primary and secondary synchronization signals (PSS/SSS) and the broadcasted system information. In order to improve the coverage of these scenarios, one possibility would be to increase the amount of repetition of the information on these channels.

There is a need for improved reception of system information.

System Information

The system information comprises several blocks of information of various kinds, from fundamental parameters such as in LTE which bandwidths are used for the downlink and uplink carriers, the paging cycle in use, the global cell identity, downlink bandwidth, to intra- and inter-frequency neighbor cells, as well as neighbor cells of other technologies (inter-RAT).

The procedure for acquiring broadcasted system information in LTE is specified in 3GPP Technical Specification (TS) 36.331 V12.4.1 section 5.2.2. The description below relates to legacy LTE UEs, whereas the transmission of system information may very well be different for MTC UEs. This may apply both to the content of the system information transmitted to these UEs, and also procedures and timing for the transmissions.

The system information blocks that a UE in idle mode is to read when entering an LTE cell are:

MIB: DL bandwidth, PHICH configuration, system frame number.

SIB1: Comprising
  Access information and cell identity, tracking area code, PLMN identities,
  cell selection information,
  TDD configuration,
  maximum allowed UL transmit power,
  scheduling of remaining SIBs, and indication whether SIBs have changed
  etc.

SB2: Comprising information on the serving cell
  Barring information,
  Radio resource configuration common to all UEs
    configuration of physical channels,
    reference signal transmit power,
    etc.
  UE timers and constants,
  UL carrier frequency and bandwidth,
  MBSFN subframe configurations,
  etc.

SB3: Comprising common parameters for cell re-selection to intra-frequency neighbor cells
  Hysteresis for re-selection
  Threshold for when to search for inter-frequency and inter-RAT neighbors
  Threshold for when to search for intra-frequency neighbors
  Maximum allowed UL transmit power in neighbor cells,
  Reselection timer applicable for intra-frequency cell reselection
  etc.

SB4: Comprising cell-specific settings for intra-frequency cell reselection
  List of intra-frequency neighbor cells good for reselection
    Cell identity
    Individual offset to the common reselection hysteresis in SIB3
  Black list of intra-frequency neighbors not to consider for reselection
    Cell identity
  etc.

SIB5: Comprising list of common as well as cell-specific settings inter-frequency cell reselection
  Inter-frequency carriers
  Cell reselection priority, per carrier
  Cell reselection threshold for higher priority search (reference signal received power and quality, respectively), per carrier
  Cell reselection threshold for regular search (reference signal received power and quality, respectively), per carrier
  Cell reselection timer, per carrier
  Common offset for cell reselection hysteresis, per carrier
  List of intra-frequency neighbor cells good for reselection, per carrier
    Cell identity
    Individual offset to the common reselection hysteresis
  Black list of intra-frequency neighbors not to consider for reselection, per carrier
    Cell identity
  Cell configurations (partial information about MBSFN pattern, TDD UL/DL subframe allocation, . . . ), per carrier
  etc.

SIB6: Comprising list of common as well as cell-specific settings for inter-RAT cell reselection to Universal Terrestrial Radio Access Network (UTRAN)
  Corresponding to SIB5

SIB7: Comprising list of common as well as carrier-specific settings for inter-RAT cell reselection to GSM EDGE Radio Access Network (GERAN)
Corresponding to SIB5

SIB8: Comprising list of common as well as cell-specific settings for inter-RAT cell reselection to Code Division Multiple Access 2000 (CDMA2000)
Corresponding to SIB5

For full specification see 3GPP TS 36.331 V12.4.1 section 6.2.2 for MIB and SIB1, and section 6.3.1 for SIBs 2 to 8.

The UE will read the system information again when paged on that the system information has been updated (changed SIBs to be read) or when a timer has expired (usually after 3 hours; complete set of SIBs as outlined above).

The system information is used for mobility in idle mode. Usage of the information for cell reselection is described in 3GPP TS 36.304 V12.3.0 section 5.2.4.

The system information blocks outline here are modified only at certain times, and the information remains constant during a so called BCCH modification period, which corresponds to 2, 4, 8 or 16 times the paging cycle in use; the least duration of a BCCH modification period is 640 ms. Hence SIBs can be soft combined as long as the redundancy versions (RVs) are collected from the same modification period. Thus in unfavorable radio conditions RVs in several TTIs (e.g. 80 ms TTI for SIB1) can be combined.

The MIB is different in this respect in that it differs on TTI basis (40 ms TTI) due to that in addition to essential system information parameters it also carries the most significant 8 bits of the system frame number counter, which is incremented every 40 ms; see e.g. 3GPP TS 36.331 V12.4.1 (MasterInformationBlock and PHICH-Config). The MIB contains 10 spare bits for future use and which are set to 0 in releases up to Release 12. The future usage that is discussed includes extension of the SFN counter, which would be incremented once every 1024 radio frames (10.24 sec), and additional signaling of semi-static nature.

Physical Layer Processing—Transmitter Side (e.g. at Another Device or at a Network Node, Such as an eNodeB or Base Station)

The 24 bits of information carried in the MIB code block are appended with a Cyclic redundancy check (CRC) check sum of 16 bits, in a procedure described in 3GPP TS 36.212 V12.3.0 sections 5.1.1-2, resulting in a transport block of 40 bits to be transmitted. The CRC check sum is further masked (bits are toggled) to indicate the number of Tx ports used by the eNodeB; see the following table (Table 1).

TABLE 1

CRC mask for indication of number of transmit antenna ports (3GPP TS 36.212 V12.3.0 section 5.3.1).

| Number of transmit antenna ports at eNodeB | PBCH CRC mask $<x_{ant,\,0}, x_{ant,\,1}, \ldots, x_{ant,\,15}>$ |
|---|---|
| 1 | <0, 0, 0, 0, 0, 0, 0, 0, 0, 0, 0, 0, 0, 0, 0, 0> |
| 2 | <1, 1, 1, 1, 1, 1, 1, 1, 1, 1, 1, 1, 1, 1, 1, 1> |
| 4 | <0, 1, 0, 1, 0, 1, 0, 1, 0, 1, 0, 1, 0, 1, 0, 1> |

The transport block is subjected to channel coding, 3GPP TS 36.212 V12.3.0 section 5.1.3, using a tail biting convolutional code (illustrated by the example convolutional encoder of FIG. 1) with code rate 1/3 with constraint length 7 (represented by the 7−1=6 memory elements 101, 102, 103, 104, 105, 106), meaning that each information bit ($c_k$, input at 151) results in 3 encoded bits ($d_k^{(0)}$, $d_k^{(1)}$, $d_k^{(2)}$, output at 152, 153, 154, respectively) and there are $2^{7-1}$=64 different states. In the example convolutional encoder of FIG. 1, the generator polynomials for $d_k^{(0)}$, $d_k^{(1)}$ and $d_k^{(2)}$ are $G_0$=133(octal), $G_1$=171(octal) and $G_2$=165(octal), respectively.

$G_0$=133(octal)=1011011(binary) means that $d_k^{(0)}$ is generated by (binary) addition of the current information bit 151 and previous information bits delayed by 2, 3, 5 and 6 time units as illustrated by adders 112, 113, 115 and 116. $G_1$=171 (octal)=1111001(binary) means that $d_k^{(1)}$ is generated by (binary) addition of the current information bit 151 and previous information bits delayed by 1, 2, 3 and 6 time units as illustrated by adders 121, 122, 123 and 126. $G_2$=165 (octal)=1110101(binary) means that $d_k^{(2)}$ is generated by (binary) addition of the current information bit 151 and previous information bits delayed by 1, 2, 4 and 6 time units as illustrated by adders 131, 132, 134 and 136. Tail biting means that the initial state of the encoder is determined by the last 6 bits of the transport block as opposed to in regular coding where the encoder starts in initial state 0.

The encoded transport block of length 120 bits is then subjected to rate matching according to the procedure in 3GPP TS 36.212 V12.3.0, section 5.1.4.2, comprising sub-block interleaving (rearrangement of the bits in each of the 3 outputs in FIG. 1), bit collection and arrangement of the bits into a circular buffer, and bit selection, i.e. extraction of bits from the circular buffer. The number of bits that finally are sent in a TTI (40 ms) is 1920 when normal cyclic prefix is used (3GPP TS 36.211 V12.4.0 section 6.6.1).

FIG. 2 illustrates transport channel processing for BCH (3GPP TS 36.212 V12.3.0 section 5.3.1) with A, K, D and E corresponding to 24, 40, 120 and 1920 bits, respectively (where A is the number of bits in the signal 211—$a_0$, $a_1, \ldots, a_{A-1}$, K is the number of bits in the signal 212—$c_0$, $c_1, \ldots, c_{K-1}$, D is the number of bits in the signal 213—$d_0^{(i)}$, $d_1^{(i)}, \ldots, d_{D-1}^{(i)}$, and E is the number of bits in the signal 214—$e_0, e_1, \ldots, e_{E-1}$).

The rate matched 1920 bits are subjected to scrambling using a cell-specific scrambling sequence that is initialized for each chunk of 1920 bits (3GPP TS 36.211 V12.4.0 section 6.6.1), and modulated by QPSK by which each pair of bits forms a modulation symbol, resulting in 960 modulation symbols to transmit (3GPP TS 36.211 V12.4.0 section 6.6.2). Depending on whether one or multiple transmission ports are used by the eNodeB, the modulation symbols may be subjected to layer mapping and precoding.

The 960 modulation symbols are mapped onto the central 72 subcarriers in the first 4 OFDM symbols of slot 1 (see FIG. 3 illustrating location of PBCH in the time-frequency resource grid for one radio frame, where the x-axis represents time in sub frame numbers, the y-axis represents frequency as subcarriers, and 351 indicates the central 72 subcarriers), in 4 consecutive radio frames, where the first out of the four consecutive radio frame fulfills mod$_4$(sfn)=0 (3GPP TS 36.211 V12.4.0 section 6.6.4).

FIG. 3 illustrates location of various signal parts in subframes 0 (352), 1, 2, 3, 4, 5 (353), 6, 7 of the time-frequency resource grid. PSS is illustrated as horizontally striped fields 362, 365, SSS is illustrated as diagonally striped fields 361, 364, and PBCH as diagonally striped field 363. CRS is illustrated by small squares and a distinction is made between black squares 366 illustrating CRS that is always present and white squares 367 illustrating CRS that is sometimes present.

Physical Layer Processing—Receiver Side (e.g. at a Communication Device, Such as a UE)

The processing on the receiver side comprises:
Demodulation and demapping
Descrambling
Rate restoration, resulting in a transport block of 120 bits
Decoding, resulting in code block of 40 bits CRC check and removal, resulting in either retrieving the 24 bit MIB successfully plus information on number of transmission ports in use by the eNodeB, or an indication on that the decoding has failed.

In favorable radio conditions the UE can attempt decoding the MIB already after having received one out of the 4 PBCH blocks, since there is much redundancy introduced by the rate matching (the encoded transport block is repeated 16 times). Since it at this point generally is unknown whether the first, second, third or fourth instance has been received, the UE may investigate all possibilities and hence repeat Descrambling, Rate restoration, Decoding and CRC check four times.

When the next instance of PBCH is received the UE repeats the procedure, but also has to take into account that the second instances might come from another 40 ms period, by which it cannot be combined and decoded together with the first instance, since the SFN carried differs. This procedure is repeated until either the MIB is successfully received, as indicated by a CRC check, or all possibilities have been exhausted (to secure that 4 PBCH instances from the same 40 ms TTI have been collected, the device needs to collect and repeat the outlined process for 7 such instances).

Viterbi Decoder

The Viterbi algorithm is described e.g. in Forney, G. D, Jr. "The Viterbi algorithm", Proc. IEEE, Vol. 61(3), pp. 268-278, March 1973 and multiple versions exist. A very brief overview of a non-limiting exemplary algorithm is provided here.

The Viterbi algorithm may, for example, be used to decode messages encoded with the convolutional encoder used in LTE, for which the algorithm operates with $2^6$ (64) states since the depth of the shift register is 6 (FIG. 1). Since each bit fed to the encoder produces a 3 bit code word segment as output, there are $2^3$ (8) possible encoder outputs. However, a state (of the encoder and in the trellis of the Viterbi decoder) reflects the bits that have been fed from the message to be encoded. Hence, the encoder output for a transition to a subsequent state is constrained to only two options:

Previous state arithmetically shifted towards the least significant bit, and with the most significant bit set to zero, and Previous state arithmetically shifted towards the least significant bit, and with the most significant bit set to one.

When for a given current (also referred to as previous herein) state a code word segment is received, a decoder operating in accordance with the Viterbi algorithm computes the so called branch (transition) metrics that essentially indicates how well the received code word segment matches the conditions for transition to a subsequent state along each of the two branches.

Each current state is associated with an accumulated so called path metric, which indicates how well all transitions between states up to the current code word segment have matched the conditions.

For a given subsequent state, the algorithm computes the total metric (path metric plus branch metric) for the transitions from two current states to the subsequent state, and selects the incoming path that displays the best metric, which now becomes the path metrics of the subsequent state.

When the next code word segment has been received, the procedure is repeated again but this time the previously subsequent state is now a current state. At the end, when the last code word segment has been received, the algorithm determines the final state that is associated with the best metric, and then carries out a so called trace-back whereby it identifies all the preceding states, and maps the sequence of states to binary representation i.e. "0s" and "1s".

Convolutional encoding with tail biting leads to that the initial state can be any of the 64 states—it depends on the last 6 bits of the original message that was encoded. Hence, all options need to be considered in the decoding and one cannot for instance assume that initial state 0 has been used (as customary when tail biting is not used). Moreover, since the last 6 bits of the message have defined the initial state, one may train the decoder by feeding bits from the end of the transport block, in what is referred to as a Circular Viterbi algorithm (CVA).

FIG. 4 schematically illustrates two segments 401, 402, of a trellis corresponding to the convolutional encoder example above and a sketch of branches 411, 412, 413, 414, 415, 416, 417, 418 in the corresponding Viterbi decoding. The 64 possible states ranges from $000000_2$ to $111111_2$, and each of the possible states is represented at three different stages of the trellis as illustrated by 420-428, 430-438 and 440-448 in FIG. 4. Branch metrics are calculated by comparing the branch conditions with the received code word or code word segment.

The technical field of trellis representation and Viterbi decoding is well known in the art and will not be elaborated on in depth. For example, a decision regarding which of the state transitions 411 and 413 into state 446 will be chosen may be based on branch metrics of transitions 411 and 413. Using the previously discussed convolutional encoder example, the branch metric of transition 411 may be calculated based on a difference between the received code word segment in 402 and the code word segment $100_2$ (encoded bits, corresponding to an information bit equal to 1) of the transition 411, and similarly for any transition of the trellis.

Some Example Problems

Due to the difference between system frame numbers in adjacent TTIs it is not possible to combine PBCH blocks across the 40 ms TTI border, only inside. Hence in unfavorable radio conditions the UE has to try multiple times until it successfully has decoded the MIB using the four blocks transmitted in the same 40 ms period, if at all possible.

In extended coverage scenarios the device typically shall operate at 15 dB lower SINR than in up to and including 3GPP Release 12. When receiving PBCH at say SINR −21 dB the likelihood of successfully decoding the MIB in a single shot or attempt is extremely low. This has led to a proposal in 3GPP on repeating the PBCH up to 10 times in the same 40 ms period leading to a code rate of 0.002 (40 information bits including CRC to transmit, 19200 bits used), i.e., extremely high redundancy and robustness. One drawback is that this consumes system resources and reduces the achievable system throughput by up to 5.2 Mbps (assuming 64QAM and 4 layers) or about 450 Gb/day in every cell supporting extended coverage.

It should be noted that the above scenario regarding PBCH block reception and MIB decoding are only provided as an example scenario where embodiments may be applicable. Similar problems may occur in many different decoding scenarios. Also, embodiments may be equally applicable in numerous decoding scenarios.

EP 1811711 A1 discloses a method for handling a difference between a first and second message prior to decoding using codeword properties. Multiple messages are combined under the hypothesis that the value of a message portion corresponding to any subsequent observed transmission is different. A convolutional decoder could operate on first and subsequent codeword observations by embedding hypotheses on the information word differences between the first and subsequent codeword observations in the branch metric computations used to construct the trellis state metrics.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of some embodiments to solve or mitigate at least some of the above or other disadvantages.

For example, a possibility for improved reception of system information is to increase or improve the accumulation of information at the receiver side.

More generally, it may be desirable to be able to decode a first received code word (to retrieve the corresponding first message) using the first received code word and a second received code word (associated with a corresponding second message) where the first and second messages are not equal but have some properties in common.

According to a first aspect, this is achieved by a method of a communication device of decoding a first message, wherein the first message and a second message are encoded by a code to produce a first code word and a second code word, respectively. The code is represented as a state machine, wherein a state transition of the state machine has a previous state and a subsequent state and is associated with a corresponding segment of the code word.

The method comprises receiving the first and second code words as distorted over a communication channel and hypothesizing a plurality of differences between the first message and the second message. The differences are one or more symbols of the first message differing from corresponding symbols of the second message, and each hypothesized difference corresponds to a hypothesized value of a part of the first message.

The method also comprises selecting an initial code word segment having a plurality of initial states as associated previous states, wherein each of the initial states is associated with a corresponding one of the hypothesized differences and is uniquely defined by the respective hypothesized value of the part of the first message.

The method further comprises decoding the first message by (for each code word segment of the received first code word, starting with the initial code word segment):
  combining the code word segment of the received first code word with a transformed code word segment of the received second code word to produce a combined code word segment, wherein the code word segment of the received second code word is transformed based on the hypothesized difference of the initial state associated with the previous state of the state transition corresponding to a first message segment content;
  determining a decision metric associated with a probability that the combined code word segment corresponds to the first message segment content;
  selecting, for the first message, the first message segment content or a second message segment content based on the decision metric; and
  if the first message segment content is selected, associating the subsequent state of the state transition corresponding to the first message segment content with the initial state associated with the previous state of the state transition.

In some embodiments, the method may further comprise (if the second message segment content is selected) associating the subsequent state of the state transition corresponding to the second message segment content with the initial state associated with the previous state of the state transition corresponding to the second message segment content.

In some embodiments, the applicable initial state (implying an applicable hypothesized difference) may be propagated along the code word segments of the state machine realization as the decoding progresses.

If the second message segment content is selected the subsequent state of the state transition corresponding to the second message segment content may be associated with the initial state associated with the previous state of the state transition.

The part of the first message may, for example, be a part comprising a counter, such as a system frame number (SFN).

In some embodiments, the hypothesized value of the part of the first message may correspond to a hypothesis regarding the SFN of the first message and the hypothesized difference may be derived from one or more of: the hypothesized SFN, a (known) time between reception of the first and second code word, and a hypothesis regarding the position within a TTI of the received first code word.

Combining the code word segment of the received first code word with a transformed code word segment of the received second code word may, according to some embodiments, comprise soft combining each symbol of the code word segment of the received first code word with a corresponding symbol of the transformed code word segment of the received second code word.

In some embodiments, the code word segment of the received second code word and the transformed code word segment of the received second code word may differ by the hypothesized difference of the initial state associated with the previous state of the state transition corresponding to the first message segment content.

In some embodiments, a length of the part of the first message (e.g. an SFN) may be equal to or larger than a length of a state of the state machine (e.g. a constraint length of a convolutional encoder).

If a length of the part of the first message (e.g. an SFN) is larger than a length of a state of the state machine (e.g. a constraint length of a convolutional encoder), the method may further comprise dividing the part of the first message into an initial state defining part and a state machine realization part, wherein a length of the initial state defining part equals the length of the state of the state machine and instantiating a plurality of state machine realizations wherein each of the state machine realizations is associated with a respective value of the state machine realization part.

The hypothesizing, selecting and decoding steps may be performed for each of the plurality of state machine realizations and decoding the first message may further comprise selecting one of the plurality of state machine realizations to define the decoded first message based on the decision metric of each of the plurality of state machine realizations.

In some embodiments, each state machine realization may be a trellis of a Viterbi decoder.

In some embodiments, the method may further comprise decoding the second message by (for each code word segment of the received second code word) selecting, for the second message, the first message segment content or the second message segment content based on the decision metric. These embodiments may represent a separate decoding being performed for the first and second code words (e.g. by keeping of two separate trellises), while the decision metric at each selection instant may be the same (i.e. the first and second metric combined).

In some embodiments, the method may further comprise decoding the second message by compensating the decoded first message for the hypothesized difference of the initial state associated with a final state corresponding to the decoded first message. These embodiments may represent decoding being performed for the first code word (e.g. by keeping of one trellis only), while decoding of the second code word comprises compensating the result of the decoding of the first code word for the hypothesized difference (e.g. toggling of differing symbols).

The symbols may be bits according to some embodiments.

The code may, in some embodiments, belong to at least one of the following code categories: tree codes, trellis codes, convolutional codes, turbo codes, and tail biting codes.

According to some embodiments, the decoding may apply at least one of the following decoding approaches: trellis decoding, sequential decoding, iterative decoding, Viterbi algorithm, Bahl-Cocke-Jelinek-Raviv—BCJR—algorithm, Fano algorithm, stack algorithm, creeper algorithm, turbo decoding, sliding window decoding, list decoding.

The first and second messages may be master information blocks (MIB) and the first and second code words may be received at different points in time (e.g. in different transmission time intervals (TTI)).

Each of the hypothesized differences may, according to some embodiments, comprise one or more of: different values of a counter, different system frame numbers (SFN), and different cyclic redundancy check (CRC) symbols resulting from different information symbols.

In some embodiments, the first and second messages may be master information blocks (MIB) wherein the first and second code words are received at different points in time (e.g. in different transmission time intervals (TTI)). Then, each of the hypothesized differences may correspond to a hypothesized counter value of the first message, and may comprise an increment of a counter representing different system frame numbers and a difference of cyclic redundancy check (CRC) symbols resulting from the counter increment. The hypothesized value of the part of the first message may be the hypothesized counter value and the increment may be associated with the difference between the different points in time.

Determining the decision metric may, according to some embodiments, comprise (for each state transition of the state machine) determining the decision metric as associated with a probability of the state transition conditional on the combined code word segment. The decision metric may be determined for each state transition of the state machine.

The decision metric may, in some embodiments, be determined using any suitable approach. In some embodiments, the decision metric may be determined based on (or as) one of a Hamming distance and a Euclidean distance between the code word segment of the combined code word and a code word segment corresponding to the state transition under consideration. The decision metric may be a log-likelihood ratio.

The decision metric may, according to some embodiments, be determined by combining (e.g. adding) a branch metric of the state transition with a path metric of the previous state of the state transition. In such embodiments, the path metric for the subsequent state may correspond to the decision metric for the selected state transition.

A second aspect is a computer program product comprising a computer readable medium, having thereon a computer program comprising program instructions. The computer program is loadable into a data-processing unit and adapted to cause execution of the method according the first aspect when the computer program is run by the data-processing unit.

A third aspect is a decoder, for a communication device adapted to decode a first message, the first message and a second message being encoded by a code to produce a first code word and a second code word, respectively, wherein the code is represented as a state machine, wherein a state transition of the state machine has a previous state and a subsequent state and is associated with a corresponding segment of the code word, and wherein the first and second code words are received as distorted over a communication channel.

The decoder comprises a controller adapted to hypothesize a plurality of differences between the first message and the second message, the differences being one or more symbols of the first message differing from corresponding symbols of the second message, wherein each hypothesized difference corresponds to a hypothesized value of a part of the first message, select an initial code word segment having a plurality of initial states as associated previous states, wherein each of the initial states is associated with a corresponding one of the hypothesized differences and is uniquely defined by the respective hypothesized value of the part of the first message, and decode the first message.

Decoding the first message is done by, for each code word segment of the received first code word, starting with the initial code word segment:

combining the code word segment of the received first code word with a transformed code word segment of the received second code word to produce a combined code word segment, wherein the code word segment of the received second code word is transformed based on the hypothesized difference of the initial state associated with the previous state of the state transition corresponding to a first message segment content;

determining a decision metric associated with a probability that the combined code word segment corresponds to the first message segment content;

selecting, for the first message, the first message segment content or a second message segment content based on the decision metric; and if the first message segment content is selected, associating the subsequent state of the state transition corresponding to the first message segment content with the initial state associated with the previous state of the state transition.

FIG. 8A illustrates an example implementation with similar functionality as the third aspect described above and will be described later herein.

The hypothesizing step may be performed by a hypothesizer, the steps of determining the decision metric may be performed by a metric determiner, the step of producing a combined code word segment may be performed by a combiner, and the step of selecting the first or second message segment content may be performed by a selector. The step of selecting an initial code word segment may also be performed by a selector, which may be the same or different from the selector selecting the first or second message segment content.

A fourth aspect is a communication device comprising the decoder according the third aspect.

In some embodiments, the third and fourth aspects may additionally have features identical with or corresponding to any of the various features as explained above or below for the first aspect.

An advantage of some embodiments is that decoding is enabled of a first received code word (to retrieve the corresponding first message) using the first received code word and a second received code word (associated with a corresponding second message) where the first and second messages are not equal but have some properties in common.

The difference between the first and second messages (and—consequently—between the first and second code word) need not be known but belongs to a known set of possible differences.

For example, the first and second messages may be master information blocks (MIB) received in different transmission time intervals (TTIs) such that they differ in their respective system frame number (SFN), e.g. differ only in their respective SFN. Different SFN may typically result in different CRC.

Another advantage of some embodiments is that, by initializing the decoding such that the initial states are uniquely defined by the part of the messages where their content may differ, the hypothesized differences may be efficiently accounted for in the decoding.

Yet another advantage of some embodiments is that if the part of the messages where their content may differ is longer than the size of a state representation of the state machine, time efficient decoding may be achieved by instantiating a plurality of state machine realizations to process all possible hypothesized differences at once.

By (soft) combining code word segments before the metric calculation some further advantages may be achieved for some embodiments. For example, since the combination relates to linearly achieved components (instead of non-linearly achieved components as may be the case when metrics are combined) increased sensitivity may be achieved.

All or some of these advantages are particularly beneficial in comparison with the disclosure of EP 1811711 A1.

BRIEF DESCRIPTION OF THE DRAWINGS

Further objects, features and advantages will appear from the following detailed description of embodiments, with reference being made to the accompanying drawings, in which.

DETAILED DESCRIPTION

Figure 1:
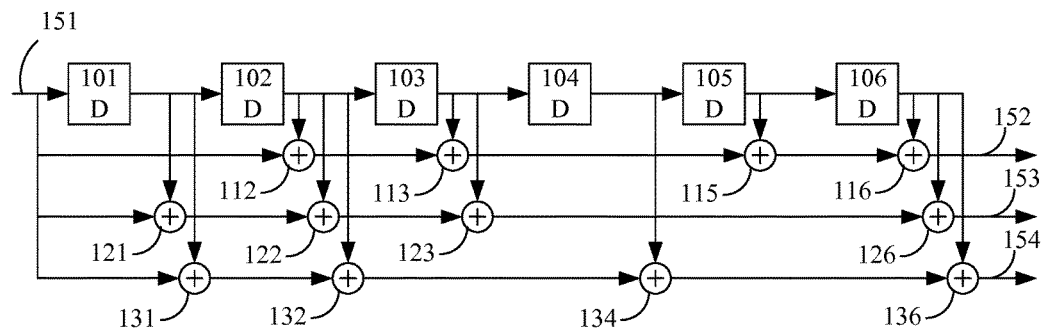
FIG. 1 is a block diagram illustrating an example convolution encoder used according to some embodiments.
Figure 2:
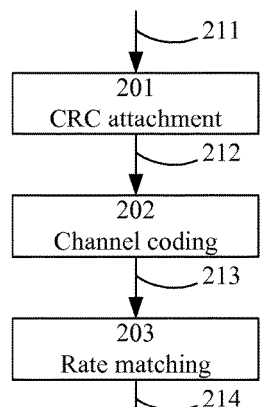
FIG. 2 is a block diagram illustrating example signal processing applied according to some embodiments.

In the following, embodiments will be described where a first received code word is decoded to retrieve a corresponding first message, and where the decoding uses at least the first received code word and a second received code word associated with a corresponding second message. Typically, the first and second messages are not equal but have some properties in common. For example, it may be known that some part(s) of the first and second messages (and/or code words) are equal and that some other part(s) of the first and second messages (and/or code words) differ, wherein the difference belongs to a set of possible differences.

For illustrative purposes, the first and second messages will be exemplified as master information blocks (MIB) received in different transmission time intervals (TTIs) such that they differ only in their respective system frame number (SFN), with corresponding differences in CRC. The first and second messages will also be referred to herein as first and second MIB instances.

Embodiments will be described where an approach to decoding of codes that may be represented via a state machine is provided. The approach is particularly useful when decoding two code words with a hypothesized (e.g. known) difference. For example, the approach includes joint Viterbi decoding of blocks (code words) with unknown content but known difference.

Then, this approach will be modified to make it more efficient in handling of first and second received code words with an unknown difference belonging to a set of possible differences.

In particular, embodiments will be presented in which the first and second code words (or corresponding code word segments) are combined (e.g. via soft combining of code symbols) to produce a combined code word segment, which is then used to determine a decision metric for the decoding process. The combining of the first and second code words is performed by combining a code word segment of the first code word with a transformed code word segment of the second code word. The transformation is based on a hypothesis regarding the unknown difference.

Three main approaches will be described an exemplified:

First approach: Combination of metrics from first and second received code words. Exemplified, e.g., by FIGS. 6B, 7A.

Second approach: Special case of first approach with selection of initial state in relation to hypothesized difference and propagation of initial state conditions. May use several instantiations of state machine if needed. Exemplified, e.g., by FIG. 5C, 6B, 7A.

Third approach: Combination (based on hypothesized difference) of first and second received code word segments before metric calculation with selection of initial state in relation to hypothesized difference and propagation of initial state conditions. May use several instantiations of state machine if needed. Exemplified, e.g., by FIGS. 5C, 6C, 7B, 8A, 8B.

Starting with decoding approaches where metrics associated with the first and second received code words are combined (as opposed to the embodiments presented later, where combining of code words is applied instead), an illustrative example embodiment will now be described followed by a more general description of some embodiments.

Some embodiments concern a modification of the Viterbi decoder that allows joint decoding of code blocks (i.e. code words) containing the same unknown information but where it is known that some bits at known positions are toggled (flipped from 0 to 1, and vice versa), representing the difference between the code blocks. This allows the MIB to be decoded using blocks from adjacent 40 ms TTIs; hence redundancy can be achieved by collecting blocks from multiple TTIs rather than to densify the PBCH transmissions within the 40 ms TTIs as suggested in the work item referred to in the background section above.

The branch metrics for the two or more jointly decoded blocks are combined in a manner that takes the toggled bits into account. Each MIB instance is decoded separately, but the decisions on the most likely path through each respective trellis is based on the combined information from all jointly decoded blocks.

LTE MIB decoding is used as an example herein. The description does not preclude usage in other radio access technologies and/or other radio channels. Moreover the description does not preclude other coding rates or parameters related to the encoding, impacting the number of bits in a code word, the number of states in a trellis, the number of branches between nodes, etc. Furthermore the description is not limited to a Viterbi decoder.

In LTE, some embodiments may be implemented in a control decoder in a physical layer circuitry.

CRC Check Sum Impact of Toggled Bits

When the SFN counter changes from 2n to 2n+1 a single bit of the MIB is toggled, whereas when the counter changes from 2n+1 to 2(n+1), 2, 3, 4, 5, 6, 7 or 8 bits are toggled. The toggled bits in the MIB result in that the CRC check sums become different, and therefore also the initial states for the convolutional encoding of the consecutive MIBs will be different.

The CRC has a linear property $CRC(x \oplus y) = CRC(x) \oplus CRC(y)$ where $\oplus$ denotes Exclusive OR (XOR), meaning that if a second MIB instance $m_2$ can be described as toggling a first MIB instance $m_1$ using a bit pattern (the difference—also referred to herein as bitmask, toggle bit pattern, and similar; resulting in corresponding state-toggle masks—also referred to herein as state-toggle patterns, state translation, and similar, and having a corresponding translator in the code word domain) x of same length, the CRC check sum for the second MIB instance can be found by calculating the CRC check sum for the bitmask x and then toggle the bits of the CRC check sum for the first MIB instance $m_1$, or in other words $CRC(m_2) = CRC(x) \oplus CRC(m_1)$.

CRC check sums for toggle bit patterns for 1 up to 8 SFN bits are shown in Table 2. The 6 least significant bits of the CRC allow the initial state for decoding of $m_2$ to be linked to the initial state for decoding of $m_1$ under each of the hypotheses.

TABLE 2

CRC-16 (generator 0x1021) check sum of toggle masks for SFN toggling in LTE.

| Toggled MIB bits | SFN toggle bit pattern x | CRC(x) |
|---|---|---|
| SFN bit 0     | $\|00000000\|00000100\|00000000\|_2$ | $\|11001100\|11000100\|_2$ |
| SFN bits [0:1] | $\|00000000\|00001100\|00000000\|_2$ | $\|01000101\|01101101\|_2$ |
| SFN bits [0:2] | $\|00000000\|00011100\|00000000\|_2$ | $\|01000110\|00011110\|_2$ |
| SFN bits [0:3] | $\|00000000\|00111100\|00000000\|_2$ | $\|01000000\|11111000\|_2$ |
| SFN bits [0:4] | $\|00000000\|01111100\|00000000\|_2$ | $\|01001101\|00110100\|_2$ |
| SFN bits [0:5] | $\|00000000\|11111100\|00000000\|_2$ | $\|01010110\|10101100\|_2$ |
| SFN bits [0:6] | $\|00000001\|11111100\|00000000\|_2$ | $\|01100001\|10011100\|_2$ |
| SFN bits [0:7] | $\|00000011\|11111100\|00000000\|_2$ | $\|00001111\|11111100\|_2$ |

Viterbi Decoder State Impact of Toggled Bits

Returning to what each state of the Viterbi decoder represents, namely the 6 most recent bits in the code block, it is realized that by concatenating the SFN toggle bit pattern and the associated CRC check sum one can relate every state in the decoding of $m_2$ to the corresponding state in the decoding of $m_1$. This allows the so called path metrics, which is a central concept of the Viterbi algorithm and which is to be minimized in order to find the transmitted message with maximum likelihood, to be combined when deciding which previous nodes to select as inputs to the current ones.

A Viterbi algorithm typically contains the following elements:

A Path Metrics Unit (PMU), dynamically connecting nodes (states for different output bits), and A Traceback Unit (TBU), converting a sequence of state transitions into binary 0s and 1s or a soft representation thereof.

The PMU further comprises:

A Branch Metrics Unit (BMU), where given a received code word segment (3 bits) and a particular node (state) and two branching words (3 bits), each associated with a separate next node (subsequent state), a cost in terms of distance between the received code word segment and a branch word is calculated, where distance may (for example) refer to any of the non-limiting examples:

Hamming distance, in case of 'hard' decoding (input to algorithm is binary values), or Euclidean distance, in case of 'soft' decoding (input to algorithm is mapped to values in, for instance, the range [0,7], where 0 is a strong binary 0 and 7 is a strong binary 1, and where 3 and 4 are weak 0s and 1s, respectively)

An Add-Compare-Select Unit (ACS), where path metric is calculated for each of up to two potential input nodes (previous states) to each node (state) representing a next node (subsequent state) wherein for each potential input the path metric at that particular node (previous state) is added to the branch metric for transition from that particular node to this next node (subsequent state); where calculated path metrics are compared; and where the input node associated with the smallest path metrics is selected as the input node to this particular next node.

Embodiments according to this example may relate to the PMU, and particularly, to the ACS.

The inputs to the algorithm are two code blocks (first and second code words) $m_1=[b_0^{(1)}\ b_1^{(1)} \ldots b_{119}^{(1)}]$ and $m_2=[b_0^{(2)}\ b_1^{(2)} \ldots b_{119}^{(2)}]$ each of length 120 bits (hard 0s and 1s, or a soft representation thereof), corresponding to 40 code word segments of 3 bits each, and a toggle pattern (difference; known or at least hypothesized) tp(l), l=0 ... 39.

For each pair of received code word segments $$c_1(n)=[b_{3n}^{(1)}\ b_{3n+1}^{(1)}\ b_{3n+2}^{(1)}], \text{ and}$$

$$c_2(n)[b_{3n}^{(2)}\ b_{3n+1}^{(2)}\ b_{3n+2}^{(2)}], n=0 \ldots 39,$$

a state-toggle mask stm(n), n=0 ... 39, may be defined based on the 40b input toggle pattern:

$$stm(n)=[tp(n)tp(n-1) \ldots tp(n-5)]$$

where bits are read out modulo-40 and where MSB is the left-most bit.

Denoting the states associated with code block (first code word) $m_1$ when code word segment $c_1$ (n) is received by $$s_k^{(1)}(n), k=0 \ldots 63,$$

the associated states for code block (second code word) $m_2$ when code word segment $c_2$ (n) has been received is $$s_k^{(2)}(n)=stm(n)\oplus s_k^{(1)}(n), k=0 \ldots 63.$$

In the ACS unit, path metrics (first and second metrics) are calculated and maintained independently of each other for the two code blocks (first and second code words) $m_1$ and $m_2$, but when comparing and deciding which input to take, the metrics are combined (e.g. added) over $s_k^{(1)}(n)$ and $s_k^{(2)}(n)\oplus stm(n)$ to produce a decision metric.

Depending on the state-toggle pattern for the previous code word segment, the order of the path metrics (i.e. the association between metric and branch) for the two potential input nodes may have to be shifted for metrics related to $m_2$ before adding them to corresponding metrics for $m_1$. Particularly, if stm(n−1)∧000001₂ is false the order of the path metrics calculated based on the code words received at time instant n, is the same for $m_1$ and $m_2$; otherwise the order of path metrics (and associated input nodes) shall be reversed for $m_2$.

For each node $s_k^{(1)}(n)$ and $s_k^{(2)}(n)\oplus stm(n)$ the input node associated with the smallest path metrics is selected.

EXAMPLE

Figure 5A:
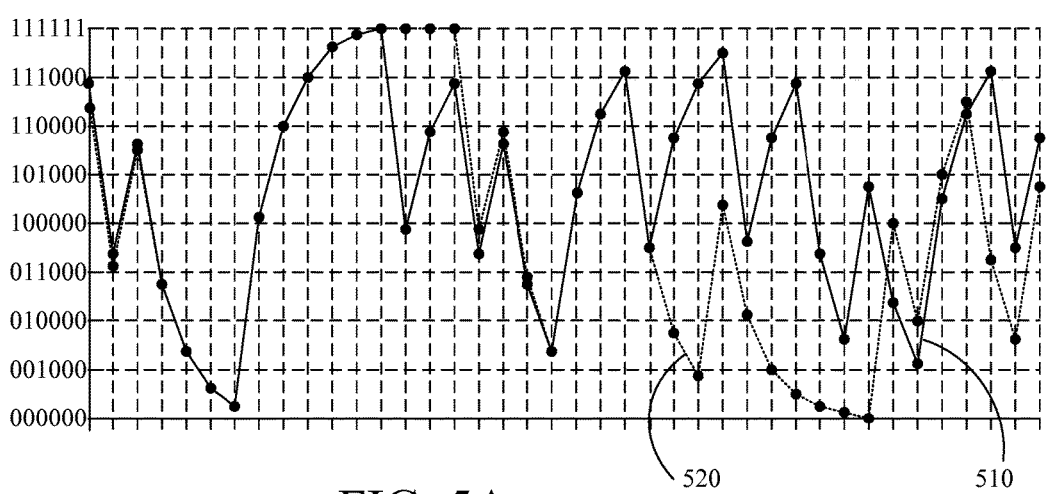
FIG. 5A is schematic drawing illustrating Viterbi decoding of two messages in an example trellis according to some embodiments.

The joint decoding of two fictive instances of MIB is shown in FIG. 5A (Joint Viterbi decoding of two instances of MIB where the LSB of the SFN counter differs). In line with conventional trellis representations, the x-axis represents the various code word segments 0 ... 38, and the y-axis represents the possible states in binary representation 000000, ..., 111111 (only some states explicitly shown in FIG. 5A).

It is hypothesized that the second instance differs from the first one by only the LSB of the SFN counter (and associated difference in CRC check sum). Thus the toggle pattern for SFN bit 0 is used (see Table 2);

|00000000|00001001|00000000|11001100|11000100|.

The messages before CRC encoding are:
  MIB instance 1: {1 0 1 0 0 0 0 1 1 1 1 1 1 0 1 1 1 1 1 0 1 1 0 1 0 0 1 1 1 0}

MIB instance 2: {1 0 1 0 0 0 0 1 1 1 1 1 1 1 1 1 0 1 0 0 1 1 0}

Due to different CRC check sums the initial and final states differ between the code blocks, but using state-toggling mask the states are connected to each other and the decoding can be based on the joint metrics. After trace back, the decoded first and second message (corresponding to CRC coded MIB instances 1 and 2) can be extracted as illustrated by 510 and 520.

More generally, this decoding approach may be described via the following method and decoder.

A Method of a Communication Device of Decoding a First Message.

The first message and a second message are encoded by a code to produce a first code word and a second code word, respectively. The code is represented as a state machine and a state transition of the state machine has a previous state and a subsequent state and is associated with a corresponding segment of the code word.

The method comprises receiving the first and second code words as distorted over a communication channel, hypothesizing a difference between the first message and the second message (the difference being one or more symbols of the first message differing from corresponding symbols of the second message), and decoding the first message.

Decoding the first message is achieved by (for each code word segment of the received first code word) determining a first metric associated with a probability that the code word segment of the received first code word corresponds to a first message segment content, determining a second metric associated with a probability that the code word segment of the received second code word corresponds to the first message segment content conditional on the difference between the first message and the second message, determining a decision metric by combining the first and second metrics, and selecting, for the first message, the first message segment content or a second message segment content based on the decision metric.

The first message segment content and the second message segment content may, for example, be a "0" and a "1", respectively.

In some embodiments, determining the first and second metrics may comprise (for each state transition of the state machine) determining the first metric associated with a probability of the state transition conditional on the code word segment of the received first code word and determining the second metric associated with a probability of the state transition conditional on the code word segment of the received second code word and on the difference between the first message and the second message. The decision metric may be determined for each state transition of the state machine.

Hypothesizing the difference may comprise knowing the difference or making an assumption regarding the difference.

In the example application area of decoding MIB, there is generally speaking an uncertainty regarding whether two PBCH blocks (physical channel level) are from the same 40 ms or not (which translates to them carrying the same message or not, i.e. a possible difference between the messages on transport level (BCH)).

In some particular examples where two MIB instances are needed to successfully decode the messages, 3 consecutive ones may be collected and it may be noted that there will only be one bit differing between 2 of those 3 instances. The hypothesizing may then be related to which two.

Decoding may be achieved using any suitable algorithm for decoding of state machine representable codes (e.g. convolutional codes) and the selection based on the decision metric may be done according to the conventional decision rules of the applicable decoding algorithm. For example, if the Viterbi algorithm is applied, the selection may comprise selecting (for each subsequent state of the code word segment) a message segment that corresponds to an incoming path having most favorable (e.g. minimum) decision metric.

The second metric may be determined in a similar manner as the first metric (only based on the applicable code word segment of the received second code word instead of the first code word) and combining the first and second metrics may comprise determining which state transition for the second code word corresponds to the state transition under consideration for the first code word based on the hypothesized difference and combining the first and second metrics according to that correspondence. For example, in a trellis representation the state transitions (of which the first and second metrics should be combined) may differ in one or more of the previous state, the subsequent state and the message segment for the transition depending on the hypothesized difference.

Alternatively, the second code word may be adapted based on the hypothesized difference before determining the second metric, in which case determining which state transition for the second code word corresponds to the state transition under consideration for the first code word is straight forward. For example, in a trellis representation the state transitions (of which the first and second metrics should be combined) have the same previous state, subsequent state and message segment for the transition in this alternative.

A Device Adapted to Decode a First Message.

The first message and a second message are encoded by a code to produce a first code word and a second code word, respectively. The code is represented as a state machine, wherein a state transition of the state machine has a previous state and a subsequent state and is associated with a corresponding segment of the code word, and wherein the first and second code words are received as distorted over a communication channel.

The decoder comprises a controller adapted to hypothesize a difference between the first message and the second message (the difference being one or more symbols of the first message differing from corresponding symbols of the second message), and decode the first message.

The controller is adapted to decode the first message by (for each code word segment of the received first code word) determining a first metric associated with a probability that the code word segment of the received first code word corresponds to a first message segment content, determining a second metric associated with a probability that the code word segment of the received second code word corresponds to the first message segment content conditional on the difference between the first message and the second message, determining a decision metric by combining the first and second metrics, and selecting, for the first message, the first message segment content or a second message segment content based on the decision metric.

The decoder may comprise a hypothesizer adapted to hypothesize a difference between the first message and the second message (the difference being one or more symbols of the first message differing from corresponding symbols of the second message).

The decoder may comprise a metric determiner adapted to (for each code word segment of the received first code word) determine a first metric associated with a probability that the code word segment of the received first code word corresponds to a first message segment content, and determine a second metric associated with a probability that the code word segment of the received second code word corresponds to the first message segment content conditional on the difference between the first message and the second message.

The decoder may comprise a metric combiner adapted to (for each code word segment of the received first code word) determine a decision metric by combining the first and second metrics.

The decoder may also comprise a selector adapted to (for each code word segment of the received first code word) select, for the first message, the first message segment content or a second message segment content based on the decision metric.

According to some embodiments, one or more of the hypothesizer, the metric determiner, the metric combiner, and the selector may be comprised in the controller.

Some embodiments save system throughput in cells supporting extended coverage of up to 5.2 Mbps (exceeding 10 times the maximum theoretical capacity in a GERAN cell). The saved resources can instead be used to accommodate more users or to provide higher peak rates or higher reliability (robustness) in dedicated communication with existing users.

In case it is decided to employ repetition of PBCH beyond the existing, e.g. for the purpose of speeding up the MIB acquisition and allowing the device to collect a certain number of PBCH blocks in shorter time than possible today, the embodiments presented herein allow fewer repetitions than otherwise would be needed, to be introduced.

Now, this approach will be modified to make it more efficient in handling of first and second received code words with an unknown difference belonging to a set of possible differences.

A scenario where some embodiments may be applicable will now be described by example. It should be understood, however, that embodiments may be equally applicable in other scenarios.

In the following, an extension of the Viterbi decoder that allows decoding of one or more master information blocks (MIB) by using information from several received instances (first and second code words) from e.g. different 40 ms periods (TTIs) is described. Apart from normal inputs of a decoder, the only input needed for the decoder is the relative distance (time between reception of the first and second code word) in 40 ms TTIs between the MIB instances used in the decoding operation which allows the difference in system frame numbers (SFN) counter values (the hypothesized difference between the first and second messages) to be determined.

The decoder makes use of the MIB structure and the decoding is started at a position (initial code word segment) in the data where each of the decoder state (initial state) can be uniquely mapped to (is uniquely defined by) 6 out of 8 bits in the SFN counter (a part of the message). When allowing paths to start in all initial states (each initial state representing a hypothesized SFN value and, thus, a hypothesized difference)—as is customary when tail biting is employed—one can evaluate a range of 64 SFN values at once (using a single state machine realization, e.g. trellis). Since the decoder state (initial state) is known (for each hypothesis), one can derive bit toggle patterns (differences) that relate one MIB instance to another, and allows translation of states between the MIB instances, further facilitating that branch metrics (or other applicable metrics) can be combined (to decision metrics) over the collected MIB instances.

In order to cover the whole range of 256 SFN values, four trellises (state machine realizations) may be maintained in parallel, each covering 64 SFN values (and each associated with respective values of the SFN symbols that do not make up the initial states), and the winning path is sought after over (selected from) all four trellises. They (the four trellis instantiations) may be based on the same branch metrics. Hence, maintaining four trellises does not lead to a fourfold increase in complexity.

One decoding operation is sufficient to decode the MIB regardless of the absolute values of the SFNs.

In the following, embodiments will be described where an approach to decoding of codes that may be represented via a state machine is provided. For example, the embodiments advantageously allow Physical broadcast channel (PBCH) repetitions for support of Enhanced Coverage to be avoided fully or kept to a minimum. This results in substantial savings of the system capacity that otherwise would be wasted on PBCH repetitions. Further, wireless devices such as UEs can acquire MIB faster when 40 ms borders do not have to be respected. Concretely this can facilitate power save in idle mode, and also reduction of autonomous gaps for SI acquisition for the purpose of reporting CGI. An illustrative example embodiment will now be described followed by a more general description of some embodiments.

Figure 5B:
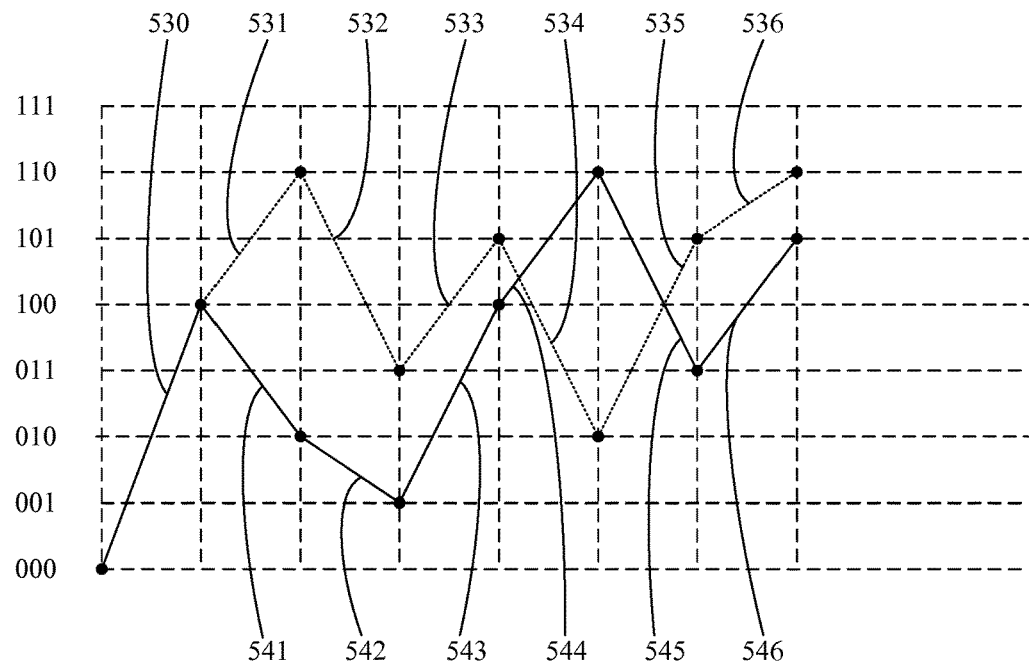
FIG. 5B is a schematic drawing illustrating a principle for combining of metrics using state translation according to some embodiments.

FIG. 5B illustrates example decoder state translation and combination of decision metrics. The principle of state translation is shown for a case with two messages with known (or hypothesized) difference. State translation may refer to a determination of which state transition of the state machine for the second code word corresponds to (and may be combined with) which state transition of the state machine for the first code word. The state translation manifests itself in that the determination of the second metric is conditional on the hypothesized difference.

FIG. 5B shows the two individual trellis paths (for the first message —530, 541, 542, 543, 544, 545, 546, corresponding to message 1001101 . . . —and for the second message —530, 531, 532, 533, 534, 535, 536, corresponding to message 1101011 . . . ). As before, the x-axis represents code word segments (or, equivalently, message segments) and the y-axis represents states. In the code of this example, each message segment consists of a single information bit.

In this example, the corresponding translator bit mask (toggle pattern, hypothesized difference) that, when applied to the second message, translates a state of that second message to a state of the first message is 0100110 . . . and results in a state translator bit mask:

|000|000|100|010|001|100|110|011| . . . .

Given that the difference between two messages is known (or hypothesized) the translator can be determined beforehand since it does not depend on the actual information carried in the messages, only on the information bits that are toggled between the two messages. Similar to how the states depend on the values of the last K−1, K being the constraint length, decoded information bits the translator depends on the corresponding last K−1 bits of a toggle pattern. The toggle pattern indicates each bit that is similar between the messages with a zero ("0") and each bit that differs with a one ("1"). The initial conditions are both zero ([000]) for the two messages of FIG. 5B.

From every state in the example it is possible to go to two other states: one state if the bit in the message is "0", and another state if the same bit is "1". For example, a transition from state [100] either can go to [010] in case of a zero or [110] in case of a one in the message(s) undergoing decoding. For each of the two branches a branch metric is computed, which essentially tells, according to some norm (e.g. Hamming, Euclidean), how well the received code symbol associated with the message bit under processing matches the condition for transition to a particular state. A small branch metric typically indicates a good match between the received code symbol and the branching condition, and vice versa.

The branch metrics for transition from a given state to either of two other states can be combined for the two messages provided that states for the second (or the first) message are translated to states for the first (or the second) message, and that branch metrics are swapped for the second (or the first) message whenever the translator has a leading one ("1"). Table 3 shows how this is carried out in this particular example.

TABLE 3

Translation for second message

| Time indication | State of first message | State translation of second message | Information bit combination |
|---|---|---|---|
| Init | 000 | 000 ⊕ 000 = 000 | |
| 0 | 100 | 100 ⊕ 000 = 100 | 1 + 1 |
| 1 | 010 | 110 ⊕ 100 = 010 | 0 + 1 |
| 2 | 001 | 011 ⊕ 010 = 001 | 0 + 0 |
| 3 | 100 | 101 ⊕ 001 = 100 | 1 + 1 |
| 4 | 110 | 010 ⊕ 100 = 110 | 1 + 0 |
| 5 | 011 | 101 ⊕ 110 = 011 | 0 + 1 |
| 6 | 101 | 110 ⊕ 011 = 101 | 1 + 1 |

The state translation of the second message is shown as a determination of the state of the first message as a bit-wise exclusive or (XOR) between the corresponding translated state of the second message and the state translator bit mask.

States for the first message and translated states for the second message are shown in Table 3, along with information on which branch metric (going to "0" or going to "1") from the second message is to be added to the corresponding branch metrics for the first message. This allows decisions on which state to go to be based on information from two (or more) messages as long as the toggle pattern can be determined beforehand. When to swap branch metrics is dictated by the toggle pattern and hence known beforehand if the difference between messages (or code words) is known.

An example method of combining metrics from two (or more) messages has been derived and exploited above, e.g. for the purpose of decoding the LTE MIB using multiple received instances in order to allow decoding at lower SINR than otherwise would be possible. The procedure can be optimized if taking particular properties of the MIB structure into account, as shown below. As before, the decoding of MIB in UMTS LTE will be used to exemplify the principles according to some embodiments.

LTE Master Information Block Structure and Impact on Decoder States

Figure 5C:
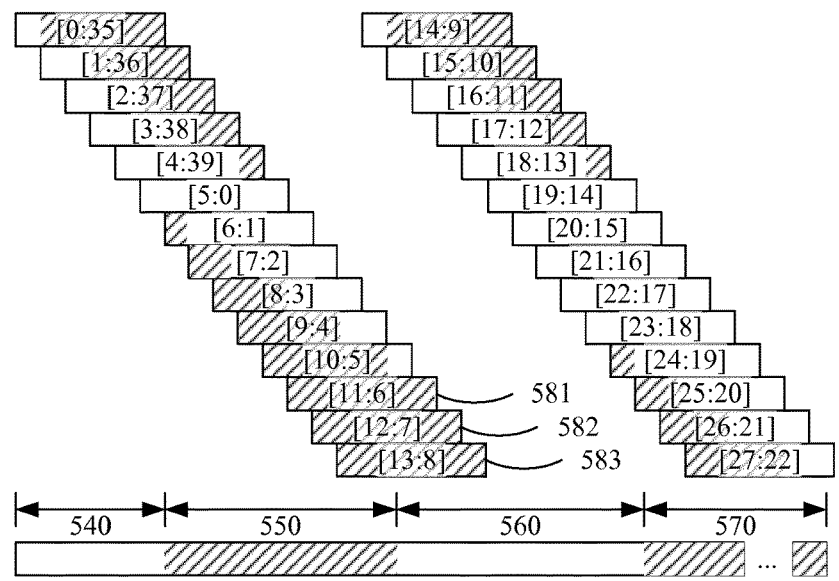
FIG. 5C is a schematic drawing illustrating an MIB block structure and relation between states and an MIB message undergoing decoding in accordance with some embodiments.

The LTE MIB consists of 24 bits plus 16 CRC (Cyclic Redundancy Check) checksum bits. The MIB code block structure is illustrated in FIG. 5C. These bits are organized such that bits 0 . . . 5 are static information bits —540, bits 6 . . . 13 are counter (SFN) bits —550, bits 14 . . . 23 are semi-static information bits—560, and bits 24 . . . 39 are CRC bits—570. Thus, some of those bits carry static or semi-static information for which it can be assumed that the values are the same between two instances of the MIB from the same cell, and some bits (the part of the message in the wording of the claims)—8 to be precise—are associated with an SFN (System Frame Number) counter and hence may differ between two instances. If for example going from SFN 2n to SFN 2n+1 only the LSBs (Least Significant Bits) differ, but when going from SFN 2n+1 to SFN 2(n+1) between 2 and 8 bits may differ. The CRC bits depend on the information sent in the messages, and hence will differ between two instances of the MIB (if received in different TTIs).

However, knowing which bits differ in the SFN field allows the difference in CRC bits to be determined beforehand. This since the CRC has a linear property $$CRC(x \oplus y) = CRC(x) \oplus CRC(y)$$

where $\oplus$ denotes Exclusive OR (XOR), meaning that if a second MIB instance $m_2$ can be described as toggling a first MIB instance $m_1$ by a toggle pattern x of same length, the CRC check sum for the second MIB instance can be found by calculating the CRC check sum for the bitmask x and then toggling the bits of the CRC check sum for the first MIB instance $m_1$, or in other words $$CRC(m_2) = CRC(x) \oplus CRC(m_1).$$

Hence for any known (or hypothesized) difference between SFN counter values between two (or more) MIBs, one can determine a toggle pattern (a hypothesized difference of the whole message) that includes not only the information bits but also the CRC check sum. As described above such toggle pattern allows branch metrics from the two blocks to be combined. In the initial part of this detailed description one such pattern was assumed per additional instance of MIB added to the joint decoding. Since a single pattern was used, in case the assumption on whether SFN changed from SFN 2n to SFN 2n+1 or SFN 2n+1 to SFN 2(n+1) between two MIB instances used in the joint decoding was incorrect, the decoding operation would have to be repeated with a new assumption in place.

To address this problem, hypotheses regarding the SFN for the first message may be built into the decoding process by starting the decoding with an initial code word segment such that the associated initial states represent different SFN values—possibly completed with having several instantiations of the state machine if all SFN values cannot be covered by a single instantiation—and each of the different SFN values correspond to a specific difference between the first and second message depending on the time difference (number of TTIs) between the first and second received code words.

Knowing (or hypothesizing) the SFNs for two (or more) messages, say N1 and N2, one can swiftly derive the toggle pattern describing differences between the two MIB instances by determining the bits that differ.

$$\text{Toggled}_{SFN_{Bits}} = N1 \oplus N2$$

and then combining (using Exclusive OR) the bit patterns in Table 4 associated with any of the up to 8 toggled bits, as indicated by that bit of Toggled_SFN_Bits carrying the value one ("1"). For instance, if N1=58 and N2=97 then Toggled_SFN_Bits=[01011011] and the 40 bit toggle pattern is constructed as Tp0⊕Tp1⊕Tp3⊕Tp4⊕Tp6.

TABLE 4

Intrinsic components for toggle patterns

| Toggled MIB bit | | SFN toggle bit pattern x | CRC(x) |
|---|---|---|---|
| SFN bit 0 | Tp0 | 00000000000010000000000 | 1100110011000100 |
| SFN bit 1 | Tp1 | 00000000000100000000000 | 1000100110101001 |
| SFN bit 2 | Tp2 | 00000000001000000000000 | 0000001101110011 |
| SFN bit 3 | Tp3 | 00000000010000000000000 | 0000011011100110 |
| SFN bit 4 | Tp4 | 00000000100000000000000 | 0000110111001100 |
| SFN bit 5 | Tp5 | 00000001000000000000000 | 0001101110011000 |
| SFN bit 6 | Tp6 | 00000010000000000000000 | 0011011100110000 |
| SFN bit 7 | Tp7 | 00000100000000000000000 | 0110111001100000 |

With the encoding used for the LTE MIB, tail-biting convolutional encoding with rate 1/3 (each information bit on the input to the encoder results in three output bits) and the constraint length K=7, each decoder state comprise 6 bits and there are 64 states in total. The trail of states associated with decoding of a message corresponds to sliding over the message and defining the state associated with each bit by the 6 most recent bits in reversed order (the most recent bit becomes the MSB of the state). The coupling between states and decoded message is shown in FIG. 5C.

Since parts of the messages have common information there are certain bit positions for which it is known either that:
  all message decoders are in the same (but currently unknown) state (common states; those states of FIG. 5C having no striped parts), or that
  messages are in individual states where each such state is depending on the SFN of the particular message (those states of FIG. 5C having at least some striped part).

States associated with information bits 11, 12, and 13 (581, 582, 583 in FIG. 5C having no un-striped parts) comprise the 6 MSBs, 6 central bits, or the 6 LSBs of the 8 bit SFN (550) in bit reversed order. This means that for any of those bits the state is prior known provided that the SFN is correctly assumed, regardless of whatever other information is carried in the message. This property is exploited in the present disclosure (to use the position in the trellis of any of these states as the initial position for the decoding, whereby the corresponding states become the initial states).

For example, if position [13:8] is used as initial position, the initial states are uniquely defined by the value of bits [13:8] (the initial state defining part) of the SFN, while the other bits of the SFN (bits [7:6]) manifest themselves in the maintenance of four different state machine realizations, each state machine realizations being uniquely defined by the value of bits [7:6] (the state machine realization part).

It shall be noted that in case e.g. the SFN counter is extended with additional bits, directly or indirectly (e.g. adding separate counter representing the number of wrap-arounds of the existing SFN counter), the technique outlined here can readily be extended to cater also for such new bits, or for any bits that vary in a systematic manner (e.g. toggling with some periodicity, counting down to some event, or varying according to one or more prior known patterns).

In relation to FIG. 5C, it may be noted that since tail-biting is used the states at the beginning (or end) of the message depend on the bits at the end (or beginning) of the message.

Joint Decoding of Messages with Only SFN (or Actually Time) Difference Known

The examples and present disclosure allows joint decoding of multiple messages without additional hypothesizing of the absolute SFNs involved, since all possible absolute SFNs are included in the decoding via the different initial states. The key is to derive one 40 bit toggle pattern (hypothesized difference) per initial state and MIB instance (received code word) and then use that particular pattern for the path formed in the trellis associated with this particular initial state. When new branches are added to the existing paths, the states representing the new endpoints of the paths inherit information on which initial state (and/or toggle pattern) each respective path is associated with, i.e. the initial state information is propagated through the trellis by associating each subsequent state with the initial state information already associated with the previous state of a selected state transition. When the next information bit is processed, by which branch metrics is to be calculated, the toggle pattern associated with the inherited initial state is used. Thus, the association to an initial state is propagated throughout the trellis as decoding progresses.

Figure 4:
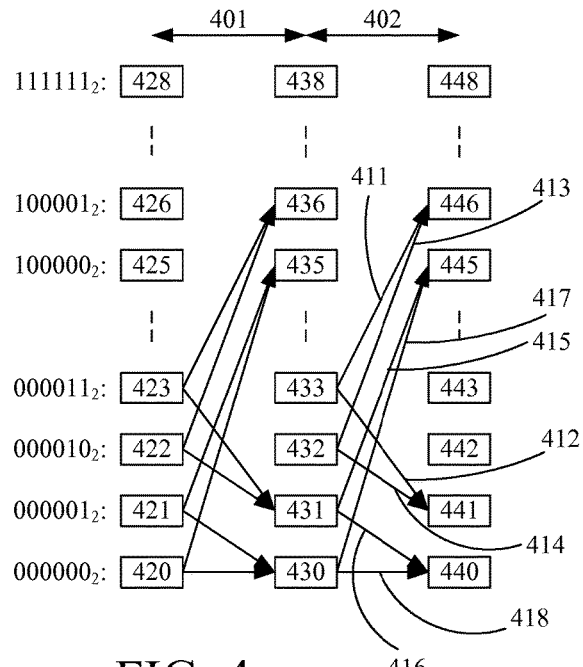
FIG. 4 is a schematic drawing illustrating part of an example trellis applicable to Viterbi decoding according to some embodiments.

FIG. 4 may be used for an exemplary illustration of how initial state information is inherited. For each new information bit being processed, there are up to two candidate branches as incoming to each node. Each of those branches are associated with a different initial states, and hence when forming path metrics to decide which branch to select, two different toggle patterns are used.

If, in the leftmost set of states in FIG. 4, each state (e.g. 420, 421, 422, 423) is associated with the corresponding state content (e.g. 000000, 000001, 000010, 000011) then the association of each state in the middle set of states depends on which of the two input candidate branches is selected, so that the associated initial state is propagated along the leading path.

For example, a candidate branch from 421 associated with 000001 and a candidate branch from 420 associated with 000000 are input to state 430. If the candidate branch from 421 is selected as most probable according to the decoding process, state 430 will be associated with initial state 000001. Likewise, a candidate branch from 422 associated with 000010 and a candidate branch from 423 associated with 000011 are input to state 431. If the candidate branch from 423 is selected as most probable according to the decoding process, state 431 will be associated with initial state 000011, and so on for all states in the middle set of states in FIG. 4.

At the next step of the decoding procedure (processing the rightmost set of states in FIG. 4), a candidate branch from 430 (now associated with 000001) and a candidate branch from 431 (now associated with 000011) are input to state 440. If the candidate branch from 430 is selected as most probable according to the decoding process, state 440 will be associated with initial state 000001, and so on for all states in the rightmost set of states in FIG. 4.

For tail-biting encoding one can start the decoding anywhere in the message, and wrap-around at the end of the message to continue at the beginning (circular decoding). The initial state is the decoder state for the information bit immediately before the first processed bit. Thus when starting the decoding with information bit 14 (or 13, or 12), the initial state corresponds to the 6 LSBs (or 6 mid-bits, or 6 MSBs) of the SFN in reversed order. This is a well-defined state that allows a toggle pattern to be tied to an initial state, and further, allows trellises for different messages to be tied to each other.

With the only information available being the relative point in time when each MIB instance was collected, as measured in 40 ms TTIs, one does not know the value of NJ, but one knows that for instance N2=N1+3. Hence one starts decoding in all initial states, and for each state with respect to MIB message 1, one defines a toggle pattern that describes the difference between MIB messages 1 and 2. Hence for state zero [000000] one defines a toggle pattern that describes the difference between N1=0 (or 64, 128, 192) and N2=3 (or 67, 131, 195), and for state [100000] one defines a toggle pattern that describes the difference between N=(or 65, 129, 193) and N2=4 (or 68, 132, 196), and so on.

As already suggested by the recent parentheses there is an ambiguity regarding the mapping between states and SFNs. This is due to that the state carries only 6 out of the 8 bits of the SFN counter. One way to handle this is to maintain four trellises in parallel, each with different assumption on the remaining two bits. When starting decoding at information bit 14, the four trellises (or SFN search spaces) are assuming the 2 MSBs of the SFN being: 00, 01, 10 and 11, respectively. Provided that the maximum time difference between the first and the last collected MIB instance is within 64 TTIs (a reasonable assumption for the application), the correctly decoded message will be given by one of the four trellises, as indicated by attaining the smallest path metrics. The approach can easily be adapted should one start the decoding at bit 12 or 13 instead. Similarly, the approach can easily be adapted to decoding in the backwards direction.

It shall be noted that although maintaining four trellises, only one set of branch metrics need to be calculated. Hence the increase in complexity is not fourfold but lesser.

Summary of Decoder Operations

Initialization:

For each collected MIB instance (received code word) in addition to the first collected, derive four sets of 40 bit toggle patterns (hypothesized differences; one set for each state machine realization);

First set of 64 toggle patterns being associated with SFN 0 to 63 plus an offset, Second set of 64 patterns being associated with SFN 64 to 127 plus an offset, Third set of 64 patterns being associated with SFN 128 to 191 plus an offset, and Fourth set of 64 patterns being associated with SFN 192 to 255 plus an offset;

the offset being the known difference in SFN counter value between this MIB instance and the first acquired MIB instance.

Decoding:

Start decoding the code symbols received for information bit 14 (or 13, or 12; corresponding to the initial code word segment), by calculating the branch metrics associated with each respective MIB instance;

For each of the four sets of toggle patterns, combine the branch metrics for the MIB instances by translating the states from each MIB instance in addition to the first acquired one; swap the branch metrics associated with "0" and "1", respectively, should the MSB of the translator, derived from the toggle pattern, be set ("1").

For each of the four sets of combined branch metrics, where each set is associated with a particular SFN range (the state machine realization part), calculate the path metrics and select which one of the up to two branches to keep based on which candidate shows the smallest path metrics; the selected branch defining the toggle pattern to use for this particular state when decoding the next code symbol (propagate association to the initial state).

Repeat the procedure above until at least all 40 code symbols associated with the 40 bits message have been processed. Optionally continue to process the same data circularly a second or more times.

Select the path that has the smallest path metrics of all paths in the four SFN ranges. Optionally verify that the selected path starts and ends in the same state (a property of tail-biting encoding); otherwise disqualify this path and select the path associated with the second smallest path metrics, and so on.

For the selected path, trace back to get the decoded message; a traversed state with MSB set ("1") corresponding to a decoded value of one ("1"), and otherwise to a decoded value of zero ("0").

The resulting message is associated with the first acquired MIB instance, which serves as the time reference for the acquired SFN.

In a more generic way the operations can be described as follows:

Decoding a first message and a related second message jointly, where the decoding operations of the first and second messages each can be represented by moving between states in a state machine (e.g. branches in the trellis), wherein transitions from source states (previous states; states going from) to target states (subsequent states; states going to) in the (first) state machine (e.g. trellis) corresponding to the first code word are translated to corresponding transitions from source states to target states in the (second) state machine (e.g. trellis) corresponding to the second code word, the difference in corresponding source and target states being directly related to the relation between the first and the second message and to the initial states;

Combining decision metrics for corresponding transitions

Selecting corresponding target states (possibly for both state machines) based on the combined decision metric Propagating the initial state associated with the source state to the target state to maintain the relation between a path (traversed states) in the state machine corresponding to the first code word to a corresponding path in the state machine corresponding to the second code word.

The decoding operation above, wherein the first and second messages can differ by a counter value, or by values that follow a prior known sequence, and where the difference depends on when the first message and the second message are received, respectively, but where the absolute counter values or indexes in the sequence are unknown and to be determined.

The decoding operation above, wherein the first message is a MIB or parts there of (PBCH blocks) can be captured from one 40 ms TTI, and the second message is a MIB or parts thereof (PBCH blocks) captured from another 40 ms TTI (here also referred to as two instances), the mutual distance in time between the two instances being known, and therefore the difference in SFN counter values being known, but where the absolute counter values are unknown and to be determined along with the information common to the two instances.

The decoding operation above, wherein an initial state may be associated with two or more sets of corresponding target and source states (e.g. determined by toggle patterns) and where therefore the number of investigated relations between the first and the second message can exceed the number of (initial) states (LTE example: 256 possible differences between two MIBs, 64 states in the decoding, 4 toggle patterns associated with each initial state thus allowing all 256 possibilities to be investigates simultaneously).

The decoding operation above, where the decoding is started in a part of the message where the corresponding initial states of the first and the second messages can be determined and depends on the known difference between the two messages (LTE example: 6 bits of the SFN counter are captured at three particular positions, and the SFN difference is known)

The decoding operation above, wherein the code belongs to at least one of the following code categories: tree codes, trellis codes, convolutional codes, turbo codes, and tail biting codes.

The decoding operation above, where the approach may be any of: trellis decoding, sequential decoding, iterative decoding, Viterbi algorithm, Bahl-Cocke-Jelinek-Raviv—BCJR—algorithm, Fano algorithm, stack algorithm, creeper algorithm, turbo decoding, sliding window decoding, list decoding.

Figure 6A:
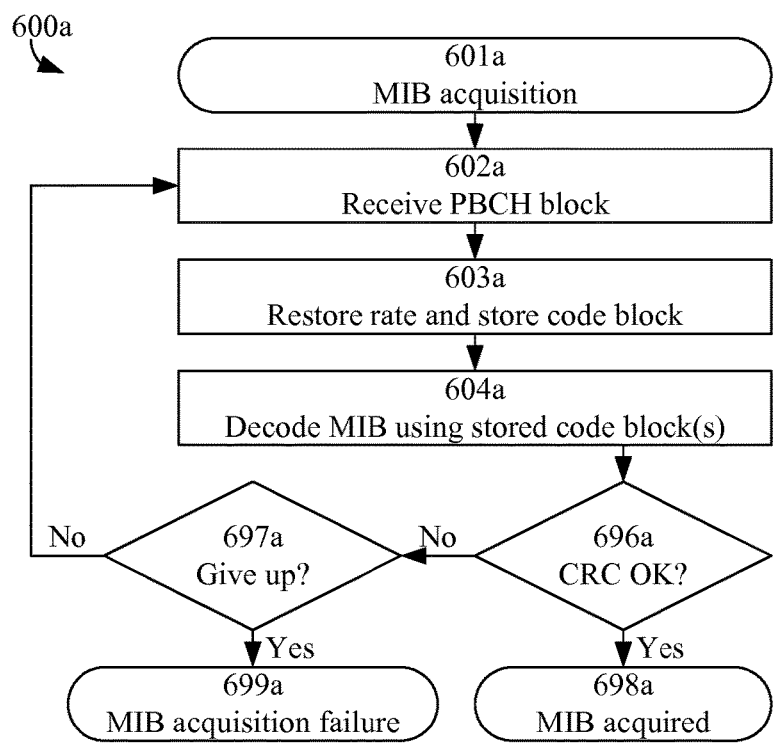
FIG. 6A is a flowchart illustrating an example of the acquisition of, and decoding using, multiple MIB instances according to some embodiments.

The decoding operation above, wherein the decision metrics to be combined is determined based on one of a Hamming distance and a Euclidean distance between the code word segment of the received first and second code word, respectively, and a code word segment corresponding to the state transition. An overall procedure 600a for decoding the MIB when the SINR is too low for it to be decoded using a single 40 ms TTI of PBCH is shown in FIG. 6A and further described below.

The wireless device is configured to acquire the MIB (601a), either autonomously as part of a cell selection or cell reselection procedure, or due to triggering by the network, e.g. as part of a handover procedure, after paging on SI update, or a request to report CGI. The wireless device may also autonomously decide to decode the MIB to validate/verify the cell, or to decode the MIB of a neighbor cell for the purpose of interference cancellation (by which PBCH can be reconstructed and subtracted from the received signal).

The wireless device receives a PBCH block (602a) and carries out rate restoration to arrive at 120 bits (hard bits or soft bits depending on strategy) comprising 40 code symbols of 3 bits each, each symbol being associated with a state transition from one message bit to the next one. The rate restored code symbols are stored in memory together with information on how many 40 ms TTIs have passed between the reception of this particular instance and the first stored one (603a).

Next the wireless device attempts to decode the first acquired MIB instance by using the at least one or more collected instances, using the approach described above, and being provided the stored code symbols and the difference in time of acquisition (604a).

After attempting to decode the message, the wireless device checks whether the CRC check sum is correct, and if so (696a; YES) the procedure ends with a successfully decoded MIB (698a). Otherwise (696a; NO), the wireless device determines whether it shall give up, where the decision may depend on how many MIB instances have been stored already. If it is determined that more attempts shall be made (697a; NO), the wireless device receives another PBCH instance (602a) and continues as described above. If on the other hand it is determined that enough attempts have been made already (697a; YES), the procedure ends with failure to acquire the MIB (699a).

Figure 6B:
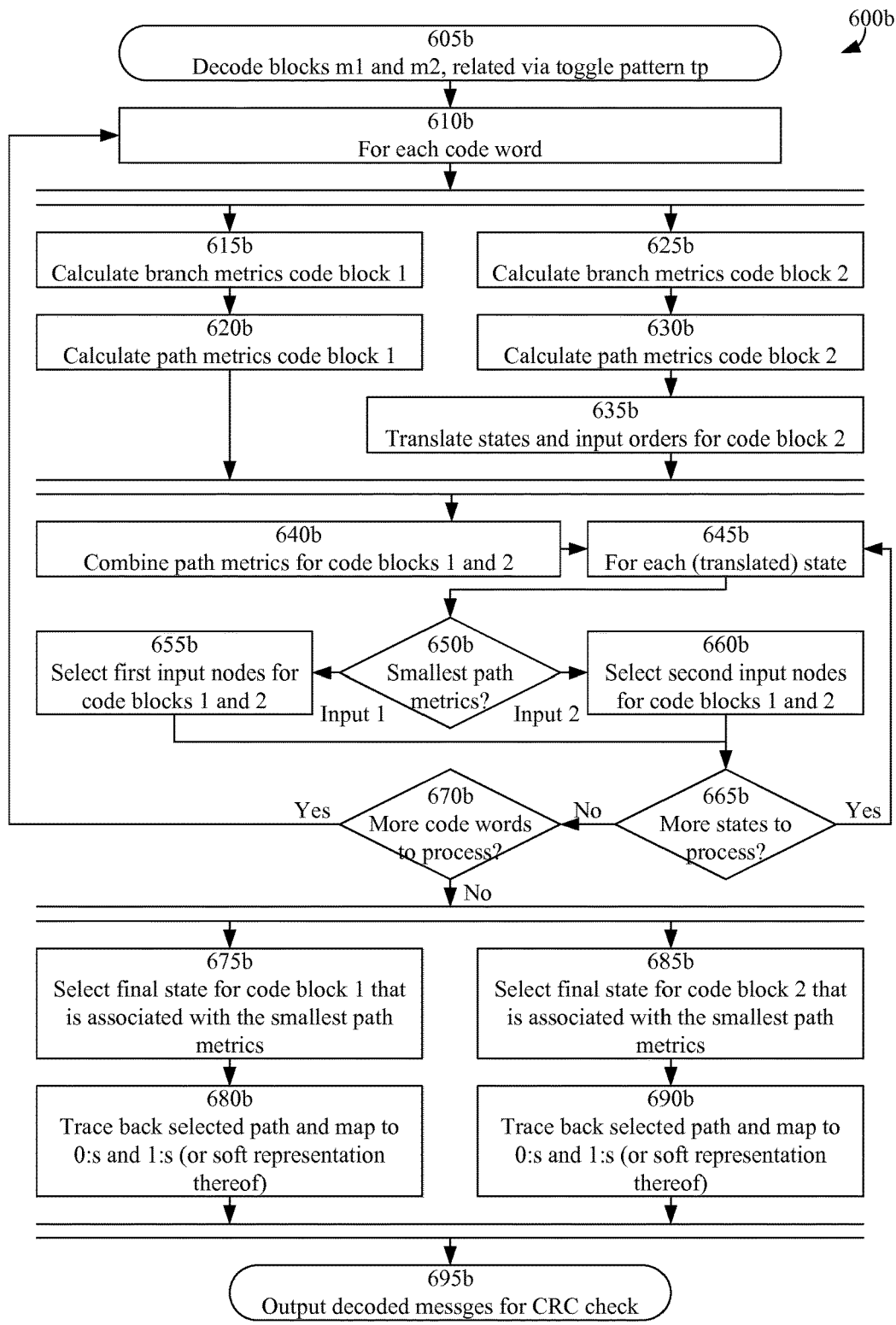
FIG. 6B is a flowchart illustrating example method steps according to some embodiments.

FIG. 6B is a flowchart illustrating an example method 600b according to some embodiments (Joint block-decoding), and may be described as follows. The method 600b is an example of an approach to decoding of codes that may be represented via a state machine. The approach is particularly useful when decoding two code words with a hypothesized (e.g. known) difference, and may be used as a basis for the approach where the initial states are selected to represent values of a part of the first message (e.g. absolute values of SFN) corresponding to respective differences of a set of possible differences.

The device (e.g. a UE) has received two instances (m1 and m2) of MIB, with known or hypothesized difference in SFN counter values, and which it is to decode. A bit toggle pattern (tp) is created which describes which bits will differ between the two MIB instances (605*b*).

The received messages carrying the two instances of MIB comprise 40 code word segments (denoted "code words" in FIG. 6B) each, where each code word segment consists of 3 bits. The device loops over the code word segments and carries out the actions described hereafter (610*b*);

Branch metrics, which describe how well a received code word segment matches the criteria for transition from one particular state to another, are calculated for the first code word, denoted "Code block 1" in FIG. 6B, (MIB instance 1) and the second code word, denoted "Code block 2" in FIG. 6B, (MIB instance 2), respectively (615*b*, 625*b*). The branch metrics may typically be defined as the discrepancy according to a norm between the bit triple describing constituting the condition for a particular transition, and the bit triple contained in the received code word segment, hence the smaller branch metric the better the match. The norm may for instance be Hamming distance in case of hard bit decoding, or Euclidean norm in case of soft bit decoding.

Path metrics, which quantify the accumulated match between the transition from a particular initial state up to and including the state arrived at after processing the current code word segment, are calculated for Code blocks 1 and 2, and for both possible transitions from a previous state to a subsequent state (620*b*, 630*b*).

The Path metric for Code block 2, related to Code block 1 via the toggle pattern, are rearranged in such manner that the Path metrics for Code blocks 1 and 2 can be added while taking the prior determined differences into account. Particularly, each state associated with Code block 2 is transformed by a toggle mask which is derived from the toggle pattern by mapping the bits representing the current and the previous 5 code word segments into a 6 bits wide bit field, with the current bit represented by the MSB. The transformed state may be determined by XOR operation of the toggle mask on each state associated with the current code word (635*b*).

For the purpose of determining which transition to do from a previous state to a subsequent state associated with current code word segment, the Path metrics for Code blocks 1 and 2 are combined into a single Path metric. Corresponding metrics for Code Blocks 1 and 2 are added, with one exception: In case the toggle mask associated with the previous code word contained an LSB set to one, and which got shifted out when creating the toggle mask associated with the current code word, the Path metrics shall be formed by adding the metrics in such manner that metrics associated with a transition to a first state for Code block 1 are added with metrics associated with a transition to a second state for Code word 2, and vice versa. For instance, if Path metrics for a particular state associated with previous code word are p11 and p12 for Code block 1 and p21 and p22 for Code block 2, in first case the combined path metrics are p11+p21 and p12+p22, whereas in second case, they are p11+p22 and p12+p21 (640*b*).

For each of the states associated with the current code word segment (645*b*), one of the two possible transitions is selected based on which is achieving the smallest Path metric. If for a particular state the smallest Path metric is associated with a first metric (650*b*; Input 1), the associated transition (branch) is selected for both Code blocks (655*b*); Otherwise (650*b*; Input 2) the other transition is selected for both Code blocks (660*b*).

When all states (665*b*; NO) and all code words (670*b*; NO) have been processed, the final states are selected for Code blocks 1 and 2, respectively (675*b*, 685*b*), based on which final state achieves the smallest path metrics.

Trace-back is carried out from each such final state (680*b*, 690*b*), where the sequences of states linking particular initial states to the selected final states are determined. The information bits are then determined from the MSB of the linked states, where a leading bit set to 1 corresponds to a binary 1, and a leading bit set to zero corresponds to a binary 0.

The two decoded MIB instances are output (695*b*) for further processing in terms of CRC check and if correctly decoded as indicated by a successful CRC check: ASN.1 decoding to interpret the contents of the MIBs.

The following example decoder operations are particularly useful when decoding two code words with a difference that depends of a time difference between a first and second received code word, and exemplifies the approach where the initial states are selected to represent values of a part of the first message corresponding to respective differences of a set of possible differences.

The MIB decoding starts with initialization of the state vectors associated with the four SFN ranges to the associated SFNs. This represents the initial states for the decoding, and if starting the decoding in bit 14 the state corresponding to a particular SFN value is determined by the 6 LSBs of the SFN in reversed order.

Toggle vectors are derived (as described above) for each of four SFN ranges and each stored MIB instance, here taking into account the offset in SFN between the first acquired MIB instance and any of the following.

The code symbol from each stored MIB instance corresponding to a state transition from a previous state to a next state are fetched. Branch metrics are calculated per MIB instance, and states are translated to corresponding states for the first MIB instance and a combined branch metric is calculated for each of the four SFN ranges—see above for details. Path metrics are calculated for each candidate branch in the four sets of metrics, each associated with a SFN range, and branches (i.e. state transitions) are selected. The state vectors are updated with the new states, and in case there are more bits to process the procedure is repeated from the fetching of a new code symbol. If all bits have been processed at least once, the path that has the minimum path metrics over all four SFN ranges is identified (and optionally validated by checking that the path starts and ends in the same state). Lastly, the decoder traces back the states traversed to acquire the 24 bits of information in the MIB and the appended 16 bit checksum.

Put in another way, by using properties of the encoded MIB one can for each MIB instance assign one toggle pattern per SFN, and evaluate all SFNs in a single decoding operation. The only information needed is information on when each MIB instance was collected.

The technique of state translations to allow branch metrics to be combined allows for not only one pattern for each MIB instance, but one pattern for each MIB instance and possible SFN. Also applied is an inheritance of which toggle pattern to use depending on which branch is selected.

Method and apparatuses in a wireless device is configured to acquire an information message. The method may comprise (with reference to FIG. 6A):
  a. Receiving over the physical layer channel a redundancy version associated with a particular instance (TTI) of the information message (602a)
  b. Demodulating and restoring rate to obtain the block of transmitted code symbols (603a)
  c. Soft-combining the received block of code symbols with previously received blocks code symbols for the same information block instance (TTI); or storing the received block of code symbols associated with another instance (TTI) separately (603a)
  d. Decoding the at least two blocks of code symbols jointly, the decoding comprising (604a)
    i. Initializing initial states of the decoder
    ii. Associating to each initial state at least one bit pattern (toggle pattern) indicating (prior known) differences between the at least two information block messages
    iii. Calculating branch metrics on code symbol basis for each of the at least two code blocks, translating decoder states for at least one of the blocks and combining into a common branch metrics;
      1. The translation being based on the at least one bit pattern (toggle pattern) for the initial state that is associated with each respective state,
      2. The translation of the source state being based on the bit pattern (toggle pattern) bits on corresponding positions as the information message bits defining the source state in reversed order.
      3. The translation of the target states being based on the bit pattern (toggle pattern) bits on corresponding positions as the information message bits defining the target states in reversed order.
      4. The order of the at least two branch metrics for each state, block and bit pattern (toggle pattern) being rearranged before the combining of branch metrics into a combined branch metrics for all blocks in case the translation bit pattern derived from the toggle bit pattern has particular values in particular bit positions (matches one or more bit patterns).
    iv. Calculating path metrics on code symbol basis for candidate source states, wherein the operation comprises for each target state:
      1. retrieving the path metrics associated with each of the one or more candidate source states, and
      2. adding the combined branch metric associated with transition from each of the candidate source states to the target state.
    v. Comparing the path metrics for the candidate source state(s) associated with each target state, and selecting the source state that has the lowest path metric when path metrics represent the discrepancy between received code symbols and conditions for a particular state transition, or otherwise the most probable path.
    vi. Inheriting the initial state (bit pattern, toggle pattern) association from the selected source state and updating the state information with the path metric resulting from the source state selection, and with information on the selected state.
    vii. Repeating from step (iii) until all code symbols from all code blocks have been processed at least once.
    viii. Identifying the overall most probable path.
    ix. Tracing back the identified best path to find the states traversed during the decoding of the blocks of code symbols, and translating from states to information message bits.
  e. Checking the integrity of the information message (696a, and if correctly received, store the information message and terminate the decoding procedure (698a). Otherwise, repeat from (a) until message is successfully decoded or it is determined (697a) (e.g. by number of code blocks already acquired and used in the joint combining) that the information message acquisition shall be terminated in failure (699a).

Combining a first and a second metrics comprises:
 adding the first and second metrics, or
 adding weighted versions of the first and second metrics Embodiments where soft combining of properly translated code symbols before metric calculation is applied instead of combining first and second metrics will now be elaborated on and exemplified.

For example, a decoding method and a decoder, e.g. a Viterbi decoder, are described herein, that allows decoding of MIB using information from several received instances from different PBCH TTIs.

Soft combining across MIB instances is introduced before the branch metrics are calculated. Typically, it is the code word segments that are transformed and soft combined before the non-linear operation of calculating branch metrics is carried out.

Example advantages of the method and apparatus provided herein include:
 Increased sensitivity stemming from linear soft combining prior to branch metric calculations instead of soft combining of the metrics itself.
 Physical broadcast channel (PBCH) repetitions for support of Enhanced Coverage may be fully avoided or kept to a minimum. This results in substantial savings of the system capacity that otherwise would be wasted on PBCH repetitions.
 Wireless devices such as UEs can acquire MIB faster when 40 ms borders do not have to be respected. Concretely, this can facilitate power saving in idle mode and/or reduction of autonomous gaps for SI acquisition for the purpose of reporting CGI.

The description herein defines differences between decoding where metrics are combined and decoding where code words are combined.

In some embodiments, code symbols are transformed and combined before calculating branch metrics, leading to a linear averaging compared to the approaches where the branch metrics, derived using non-linear operations, are combined. This results in that the decoders get different statistical properties.

Principle for Soft Combining of Code Symbols (Example)

For each information bit serving as input to a ⅓ convolutional encoder, as used for MIB, a three bit code symbol is generated (or, put differently, a code word segment comprising three binary code symbols). This code word segment determines to which out of two candidate target states (subsequent states) the source state (previous state) shall transit, where the two candidate target states (subsequent states) are defined by arithmetically shifting the source state one position towards the least significant bit (LSB), and filling the most significant bit (MSB) with 0 and 1, respectively (depending on whether the information bit that was input to the encoder was 0 or 1). In total, each code symbol can take $2^3=8$ different binary three-bit values, whereof (for each previous state) one value corresponds to a transition where the encoded information bit is 0, and one value corresponds to a transition where the encoded information bit is 1; the other 6 values are not valid for transition from a particular source state (previous state) to any of the two candidate target states (subsequent states). We will refer to the two valid three-bit values of the code symbol as branch words, or code word segments.

When jointly decoding two or more instances of MIBs, one can for each received code symbol (code word segment) translate (or transform) the source and target states (previous and subsequent states) to corresponding (transformed) source and target reference states, for instance translate states of a second MIB instance to corresponding states for a first MIB instance. As described above, branch metrics may be calculated, constituting metrics of how well the received code symbol matches any of the two branch words, and then translate states to determine which metrics should be combined to form a combined branch metric. This means that the combined quantities (branch metrics) have undergone non-linear operations (e.g. by calculating the Euclidean distance, involving squares and square roots). In these embodiments, soft combining is instead carried out on the two (or more) code symbols originating from two (or more) MIB instances, before calculating the branch metrics. This way a linear combining is achieved.

In order to be able to combine the received code symbols, one first has to find the corresponding states. The technique is the same as described above for combining of metrics:

a state translator bitmask $T_i^{(m)}(n)$ for code symbol n, relating reference state i to corresponding state of MIB instance m, is derived based on the toggle pattern a reference state $S_i^{(0)}(n)$ is XORed with the state translator bitmask to yield a corresponding state $S_k^{(m)}(n)$, k being the state corresponding to I; $S_k^{(m)}(n)$ $T_i^{(m)}(n) \oplus S_i^{(0)}(n)$ in case a translator bitmask for the next code symbol has MSB set to 1, the two candidate target states shall swap place with each other since the MSB of the state translator bitmask will modify the MSB of the target state which represents whether 0 or 1 has been received.

The transitions for the reference states can be expressed as $$S_i^{(0)}(n) \xrightarrow{\text{information bit 0}} S_p^{(0)}(n+1)$$

and $$S_i^{(0)}(n) \xrightarrow{\text{information bit 1}} S_q^{(0)}(n+1)$$

depending on whether the received code symbol is corresponding to the branch word for information bit 0 or 1. Index p denotes the target state in case 0 has been received, and q in case 1 has been received.

In for MIB instance m, the corresponding transitions can be expressed as $$T_i^{(m)}(n) \oplus S_i^{(0)}(n) \xrightarrow[\text{information bit 0}]{\text{reference}} T_i^{(m)}(n+1) \oplus S_p^{(0)}(n+1)$$

and $$T_i^{(m)}(n) \oplus S_i^{(0)}(n) \xrightarrow[\text{information bit 1}]{\text{reference}} T_i^{(m)}(n+1) \oplus S_q^{(0)}(n+1)$$

when the MSB of $T_i^{(m)}(n+1)$ is 0, and as $$T_i^{(m)}(n) \oplus S_i^{(0)}(n) \xrightarrow[\text{information bit 0}]{\text{reference}} T_i^{(m)}(n+1) \oplus S_q^{(0)}(n+1)$$

and $$T_i^{(m)}(n) \oplus S_i^{(0)}(n) \xrightarrow[\text{information bit 1}]{\text{reference}} T_i^{(m)}(n+1) \oplus S_p^{(0)}(n+1)$$

when the MSB of $T_i^{(m)}(n+1)$ is 1. The state translator bitmasks $T_i^{(m)}(n)$ and $T_i^{(m)}(n+1)$ are both based on the same toggle pattern which has been defined for or inherited by $S_i^{(0)}(n)$.

The branch words associated with a transition from source reference state to any of the two target reference states may be different from the branch words associated with a transition from MIB instance m source state to any of the two target states. Hence before combining code symbol n from two (or more) MIB instances, the code symbols have to be transformed so they can add up constructively.

Transformation of the code symbols comprises determining the bits that differ for the branch words of the corresponding state transitions for the reference states and the transformed states. This can be carried out using XOR between branch words $B_{i,0}^{(0)}(n)$ and $B_{i,1}^{(0)}(n)$ for reference states with branch words $B_{k,0}^{(m)}(n)$ and $B_{k,1}^{(m)}(n)$ for corresponding translated states for MIB instance m. The first subscript identifies the state and the second whether the transition is due to receiving information bit 0 or 1. The three bits wide bitmasks $P_{i,0}^{(m)}(n)$ and $P_{i,1}^{(m)}(n)$ specify which bits of the received code symbol n of MIB instance m for a transition from a state that translates to reference state i have to be toggled to allow combining, for received information bit 0 and 1, respectively.

$$P_{i,0}^{(m)}(n) = \begin{cases} B_{i,0}^{(0)}(n) \oplus B_{k,0}^{(m)}(n) & \text{when } MSB \text{ of } T_i^{(m)}(n+1) \text{ is } 0 \\ B_{i,0}^{(0)}(n) \oplus B_{k,1}^{(m)}(n) & \text{when } MSB \text{ of } T_i^{(m)}(n+1) \text{ is } 1 \end{cases}$$

$$P_{i,1}^{(m)}(n) = \begin{cases} B_{i,1}^{(0)}(n) \oplus B_{k,1}^{(m)}(n) & \text{when } MSB \text{ of } T_i^{(m)}(n+1) \text{ is } 0 \\ B_{i,1}^{(0)}(n) \oplus B_{k,0}^{(m)}(n) & \text{when } MSB \text{ of } T_i^{(m)}(n+1) \text{ is } 1 \end{cases}$$

In the common case of a soft-bit representation of received binary values, when in a non-limiting example the soft-bits are 3 bits, one may for instance represent binary 0 by values {0, 1, 2, 3} where 0 is a strong binary 0 (high confidence) and 3 is a weak (low confidence) binary 0. Similarly, binary 1 may be represented by values {4, 5, 6, 7}, where 7 is a strong, and 4 is a weak, binary 1. The toggling indicated by $P_{i,0}^{(m)}(n)$ and $P_{i,1}^{(m)}(n)$ then transfers to swapping {0, 1, 2, 3} with {7, 6, 5, 4}, and vice versa, for the corresponding soft-bit of code symbol n for MIB instance m.

With $C^{(0)}(n) = [b_2^{(0)}(n) \; b_1^{(0)}(n) \; b_0^{(0)}(n)]$ denoting the received code symbol n for the reference MIB instance, where each $b_\blacksquare^{(0)}(n)$ is a 3-bit soft-bit representation, $C^{(m)}(n)$ the corresponding code symbol for MIB instance m, and with $p_{i,\blacksquare}^{(m)}(n)=[p_{i,\blacksquare,2}^{(m)}(n)\ p_{i,\blacksquare,1}^{(m)}(n)\ p_{i,\blacksquare,0}^{(m)}(n)]$ where $p_{i,\blacksquare,\blacksquare}^{(m)}(n)$ is a bit indicating that a soft-bit of $C^{(m)}$ on corresponding position shall be toggled, the combining of code symbols can be described as the following non-limiting example of the combining:

$$C_{i,0}(n) = \frac{1}{M}\sum_{m=0}^{M-1}[[p_{i,0,2}^{(m)}p_{i,0,2}^{(m)}p_{i,0,2}^{(m)}]\oplus$$

$$b_2^{(m)}(n)[p_{i,0,1}^{(m)}p_{i,0,1}^{(m)}p_{i,0,1}^{(m)}]\oplus b_1^{(m)}(n)[p_{i,0,0}^{(m)}p_{i,0,0}^{(m)}p_{i,0,0}^{(m)}]\oplus b_0^{(m)}(n)]$$

and $$C_{i,1}(n) = \frac{1}{M}\sum_{m=0}^{M-1}[[p_{i,1,2}^{(m)}p_{i,1,2}^{(m)}p_{i,1,2}^{(m)}]\oplus$$

$$b_2^{(m)}(n)[p_{i,1,1}^{(m)}p_{i,1,1}^{(m)}p_{i,1,1}^{(m)}]\oplus b_1^{(m)}(n)[p_{i,1,0}^{(m)}p_{i,1,0}^{(m)}p_{i,1,0}^{(m)}]\oplus b_0^{(m)}(n)]$$

depending on reference source state i and received information bit 0 or 1. Once this operation has been carried out, $C_{i,0}(n)$ is matched against $B_{i,0}^{(0)}(n)$, and $C_{i,1}(n)$ against $B_{i,0}^{(0)}(n)$, to determine the branch metrics for reference source state i going to reference target states p and q, respectively. The following steps on determining path metrics and selecting branch is same as described for other embodiments herein.

To summarize, based on the hypothesized difference between the two or more messages, the code symbols are transformed to allow linear soft combining before the branch metrics is calculated.

Decoder Operations
Initialization:
Same as the disclosure above; For each collected MIB instance in addition to the first collected, derive four sets of 40 bit toggle patterns;
  First set of 64 toggle patterns being associated with SFN 0 to 63 plus an offset,
  Second set of 64 patterns being associated with SFN 64 to 127 plus an offset,
  Third set of 64 patterns being associated with SFN 128 to 191 plus an offset, and
  Fourth set of 64 patterns being associated with SFN 192 to 255 plus an offset; the offset being the known difference in SFN counter value between this MIB instance and the first acquired MIB instance.
Decoding:
Modified compared to the disclosure above; Start decoding the code symbols received for information bit 14, the operation comprising:
  Determining by translation associated source and target states between one MIB instance, serving as reference, and at least one other MIB instance.
  Determining the difference between branch words for corresponding transitions of the reference MIB instance and at least one other instance;
    Determined per reference state and code symbol
  Transforming the code symbols for the at least one other MIB instance such that it can be constructively combined with corresponding code symbol for the reference MIB instance;
    Transformed per reference state and code symbol
  Combining (accumulating, averaging, summing up, weighing, filtering, statistically processing) the code symbol for the reference MIB instance with the at least one transformed code symbol from the at least one other MIB instance
    Combined per reference state, code symbol, and branch (0 or 1)
  Determining branch metrics using the combined code symbol
Repeat the procedure above until at least all 40 code symbols associated with the 40 bits message have been processed. Optionally continue to process the same data circularly a second or more times.
Select the path that has the smallest path metrics of all paths in the four SFN ranges. Optionally verify that the selected path starts and ends in the same state (a property of tail-biting encoding); otherwise disqualify this path and select the path associated with the second smallest path metrics, and so on.
For the selected path, trace back to get the decoded message; a traversed state with MSB set ("1") corresponding to a decoded value of one ("1"), and otherwise to a decoded value of zero ("0").

The resulting message is associated with the reference MIB instance, which serves as the time reference for the acquired SFN.

At the 3GPP standardization meeting RAN 1#80bis it was agreed as working assumption that:
  A network supporting MTC-EC decides whether to use PBCH repetition or not.
  In case PBCH repetition is used, it shall comprise four repetitions of PBCH each 40 ms TTI
  Whether repetition is used or not shall be a semi-static property of the network A 3GPP RAN1 contribution (3GPP R1-152190) was submitted where a decoder and simulation results was provided (reproduced in Table 5 for convenience). The simulations indicate that when comparing Joint Decoding across 40 ms TTIs at SNR −15 dB with legacy decoder at SNR −12 dB (corresponding to one additional repetition at SNR −15 dB since doubling the data gives a 3 dB improvement on SNR), the MIB decoding times are on par with each other, although not identical.

TABLE 5

Performance comparison of legacy decoding and joint decoding under AWGN conditions

|  | 90% | 95% | 99% |
| --- | --- | --- | --- |
| Es/Iot −15 dB | | | |
| Legacy | 860 ms | 1125 ms | 1785 ms |
| Joint decoding | 100 ms | 110 ms | 140 ms |
| Es/Iot −12 dB | | | |
| Legacy | 90 ms | 110 ms | 140 ms |
| Joint decoding | 60 ms | 60 ms | 85 ms |

In case PBCH repetition is used according to one option of the 3GPP RAN1 working assumption it will lead to a capacity loss of 1.7 Mbps or 149 Gb per day in each cell where 10 repetition is configured. This figure is based on that PDSCH could utilize 4 layers (MIMO) and 64 QAM where the repeated PBCH otherwise would use 1 layer and QPSK.

In case no repetition is used according to the other option of the 3GPP RAN1 working assumption, the acquisition time and hence the power consumption will be large and may shorten the battery life-time of the MTC device.

Therefore, there is a need for decoders that can handle decoding of PBCH across the 40 ms TTI borders, since it would be beneficial both for the system throughput and the MTC power consumption.

Figure 6C:
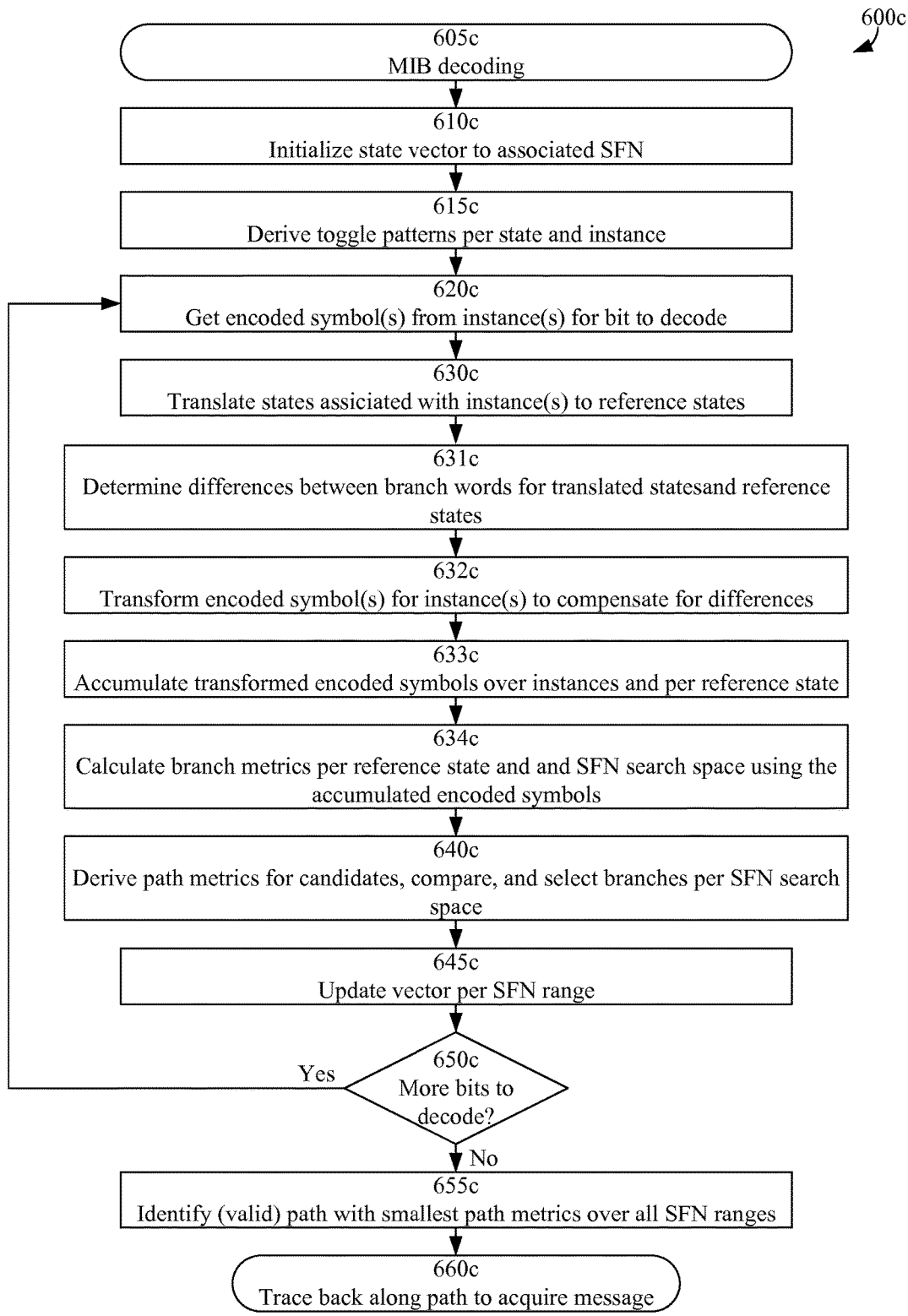
FIG. 6C is a flowchart illustrating decoder operations according to some embodiments.

FIG. 6C illustrates an example method 600c according to some embodiments where (transformed) code word segments (here; encoded symbols) from different received code words (here; instances) are soft combined (here; accumulated) before metric calculations. Main differences compared to decoder operations described above are illustrated as steps 630c-634c.

The MIB decoding (605c) starts with initialization of the state vectors associated with the four SFN ranges to the associated SFNs. This represents the initial states for the decoding, and if starting the decoding in bit 14 the state corresponding to a particular SFN value is 25 determined by the 6 LSBs of the SFN in reversed order (610c).

Toggle vectors are derived (as described above) for each of four SFN ranges and each stored MIB instance, here taking into account the offset in SFN between the first acquired MIB instance and any of the following (615c).

The code symbol from each stored MIB instance corresponding to a state transition from a previous state to a next state are fetched (620c). States corresponding to source state and target states of the reference MIB instance are determined for each of the at least one more MIB instances (630c). The differences between the branch words for the reference MIB instance and the at least one other MIB instance are determined (631c). The code symbol for the at least one other MIB is transformed so it, for each reference state and branch (to 0 or 1) can be combined with the code symbol received for the reference MIB instance (632c). The reference code symbol and the transformed code symbol for each state and branch (to 0 or 1) are accumulated or otherwise combined (633c), upon which branch metrics are calculated (634c).

Path metrics are calculated for each candidate branch in the four sets of metrics, each associated with a SFN range, and branches (i.e. state transitions) are selected (640c).

The state vectors are updated with the new states (645c), and in case there are more bits to process (650c; YES) the procedure is repeated from (620c). If all bits have been processed at least once (650c; NO), the path that has the minimum path metrics over all four SFN ranges is identified (and optionally validated by checking that the path starts and ends in the same state) (655c). Lastly, the decoder traces back the states traversed to acquire the 24 bits of information in the MIB and the appended 16 bit checksum (660c).

Figure 7A:
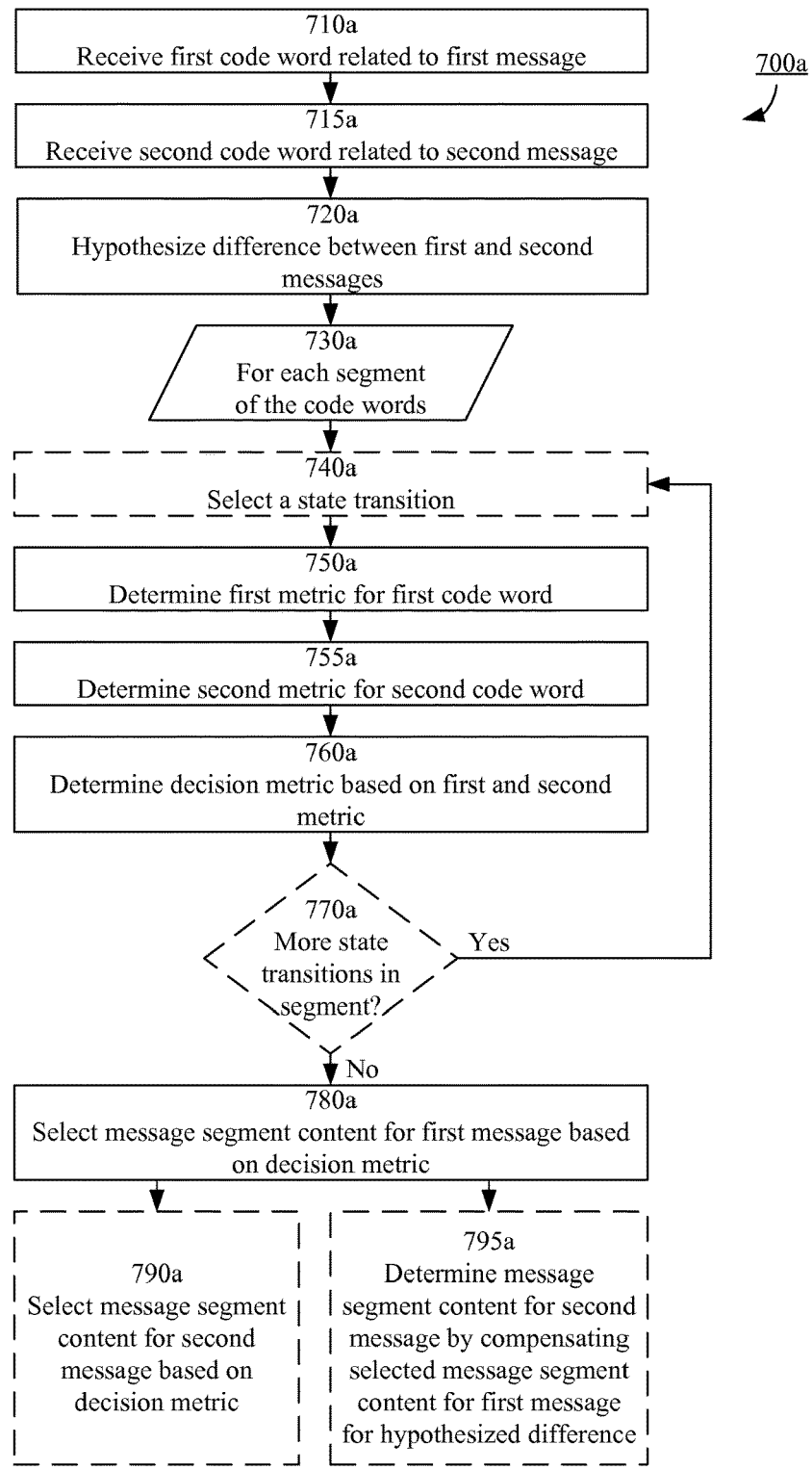
FIG. 7A is a flowchart illustrating example method steps according to some embodiments.

FIG. 7A illustrates an example method 700a according to some embodiments. The method 700a is an example of an approach to decoding of codes that may be represented via a state machine. The approach is particularly useful when decoding two code words with a hypothesized (e.g. known) difference, and may be used as a basis for the approach where the initial states are selected to represent values of a part of the first message (e.g. absolute values of SFN) corresponding to respective differences of a set of possible differences.

The method 700a may be performed by a communication device to decode a first message (and possibly a second message).

The first and second messages are encoded by a code to produce a first code word and a second code word, respectively. The encoding is typically performed by another device, which transmits the first and second code words to the device executing the method 700a. The code is represented as a state machine and a state transition of the state machine has a previous state and a subsequent state and is associated with a corresponding segment of the code word.

The code may, for example, be a tree code, a trellis code, a convolutional code, a turbo code, and/or a tail biting code.

In the example of FIG. 1, a code word segment would comprise 3 bits (the 3 output bits $d_k^{(i)}$, i=0, 1, 2) and a corresponding message segment would comprise 1 bit (the input bit $c_k$).

The first and second code words have been transmitted to the communication device over a communication channel (from the other device, e.g. a transmitter node). Hence, when received by the communication device in steps 710a and 715a, the first and second code word may be distorted due to the transmission over the communication channel.

In some applications (e.g. for MIB decoding), an attempt may first be made to decode the first message based on only the received first code word. If the attempt fails, an attempt to decode the first message based on the first and second code words may be made as will be described in the following after reception of the second code word in step 715a.

In step 720a, a difference between the first message and the second message is hypothesized (e.g. known or assumed). The difference is manifested by one or more symbols (e.g. bits) of the first message differing from corresponding symbols of the second message. This difference leads to a corresponding difference between the first and second code words (and different paths through a trellis representing the code).

Decoding of the first message is achieved by performing the steps 740a-780a, in the applicable decoding approach, for each code word segment of the received first code word as indicated by 730a (compare with 610b of FIG. 6B).

Generally, decoding may be achieved using any suitable approach or algorithm for decoding of state machine representable codes. For example, the decoding approach may apply trellis decoding, sequential decoding, iterative decoding, the Viterbi algorithm, the Bahl-Cocke-Jelinek-Raviv (BCJR) algorithm, the Fano algorithm, the stack algorithm, the creeper algorithm, turbo decoding, and/or suboptimal versions of these approaches (such as sliding window decoding, list decoding, etc.).

In step 750a (compare with 615b, 620b of FIG. 6B), a first metric associated with a probability that the code word segment of the received first code word corresponds to a first message segment content (e.g. a "0" or a "1") is determined.

In some embodiments (e.g. if a decoding approach based on a trellis representation of the code such as the Viterbi algorithm is used), determining the first metric may be associated with a probability of a particular state transition conditional on the code word segment of the received first code word.

The first metric may, for example, be a Hamming distance or a Euclidean distance between the code word segment of the received first code word and a code word segment corresponding to the first message segment content (e.g. a code word segment of a branch in a trellis representation of the code). Alternatively, the first metric may be the soft values achieved after the iterations of a turbo decoder, or any other suitable metric.

In step 755a (compare with 625b, 630b of FIG. 6B), a second metric associated with a probability that the code word segment of the received second code word corresponds to the first message segment content is determined in a similar manner as described for step 750a.

In step 760a (compare with 640b of FIG. 6B), the first and second metrics are combined to determine a decision metric. Combining the first and second metrics may, for example, comprise adding (possibly weighted versions of) the first and second metrics, but other combining approaches may be applicable depending on the type of metric used and/or on the decoding approach being applied.

In some cases (e.g. if a decoding approach based on a trellis representation of the code such as the Viterbi algorithm is used), steps 750a, 755a and 760a may be performed for all possible (or at least some) state transitions of a code word segment as indicated by 740a and 770a. In other cases (e.g. for a turbo decoder), steps 750a, 755a and 760a may be performed for the code word segment as a whole.

When steps 750a, 755a and 760a are performed for state transitions of a code word segment as indicated by 740a and 770a, the first and second metrics may be branch metrics of the state transition and the decision metric may be determined by combining the first and second branch metrics and a path metric of the previous state of the state transition. Alternatively, each of the first and second metrics may be a branch metric of the state transition combined with a respective path metric of the previous state of the state transition, and the decision metric may be determined by combining the first and second metrics.

Generally, the second metric is determined conditional on the hypothesized difference between the first message and the second message. This condition may manifest itself in various ways depending on the decoding approach being applied and/or implementation choices.

For example, the condition may be applied by first transforming the received second code word based on the hypothesized difference and then determining the second metric.

Alternatively, the condition may be applied by (e.g. in a trellis representation of the code) matching the state transition associated with the determined first metric to an appropriate state transition for determining of the second metric. This matching may comprise selecting the proper previous state, subsequent state, and/or message segment content for calculation of the second metric based on the hypothesized difference (compare with step 635 and see previous example).

In the turbo decoding example, the condition may be applied by adjusting the soft value for the second code word if the corresponding message segment differs according to the hypothesis (e.g. if the message segment has one bit only and if the message segment of the first message differs from the message segment of the second message, the soft value p of the second code word may be adjusted to I-p before combining with the soft value of the first code word).

In step 780a, a message segment content is selected for the first message based on the decision metric. The selection may be performed in various ways depending on the decoding approach being applied and/or implementation choices.

If the message segment only has a single bit (as in the example of FIG. 1), selection of the message content may comprise selection between a "0" and a "1". If the message segment comprises two or more bits and/or non-binary symbols selection of the message content may comprise selection between several alternative contents.

In the example of the Viterbi algorithm, step 780a may comprise selecting incoming path for each subsequent state of each code word segment (compare with 645b, 650b, 655b, 660b, 665b of FIG. 6B) and (when the end of the trellis is reached, compare with 670b of FIG. 6B) performing a trace back operation to compete the selection of message segment content for all code word segments (compare with 675b, 680b of FIG. 6B).

In the example of turbo decoding, step 780a may comprise selecting message segment content based on whether or not the decision metric for the corresponding code word segment is above a threshold or not.

The second message may also be decoded as illustrated by the alternative steps 790a and 795a.

According to step 790a, the second message is decoded in a manner which is analogue to the decoding of the first message, i.e. by selecting a message segment content for the second message based on the decision metric (compare with 685b and 690b of FIG. 6B).

According to step 795a, the second message is decoded by compensating the decoded first message based on the hypothesized difference (e.g. by toggling symbols/bits in the decoded first message that differ between the first and second message according to the hypothesized difference).

In some embodiments, both steps 790a and 795a may be performed and their correlation may be used to evaluate the decoding performance, to train the decoder, or for any other suitable purpose.

The method 700a may be particularly applicable when the first and second messages are master information blocks (MIB) and the difference consists of an increment of a counter (representing different system frame numbers) and a difference of cyclic redundancy check (CRC) symbols resulting from the counter increment. However, the method 700a may be applicable in numerous other scenarios where two received code words have a hypothesized difference.

Figure 7B:
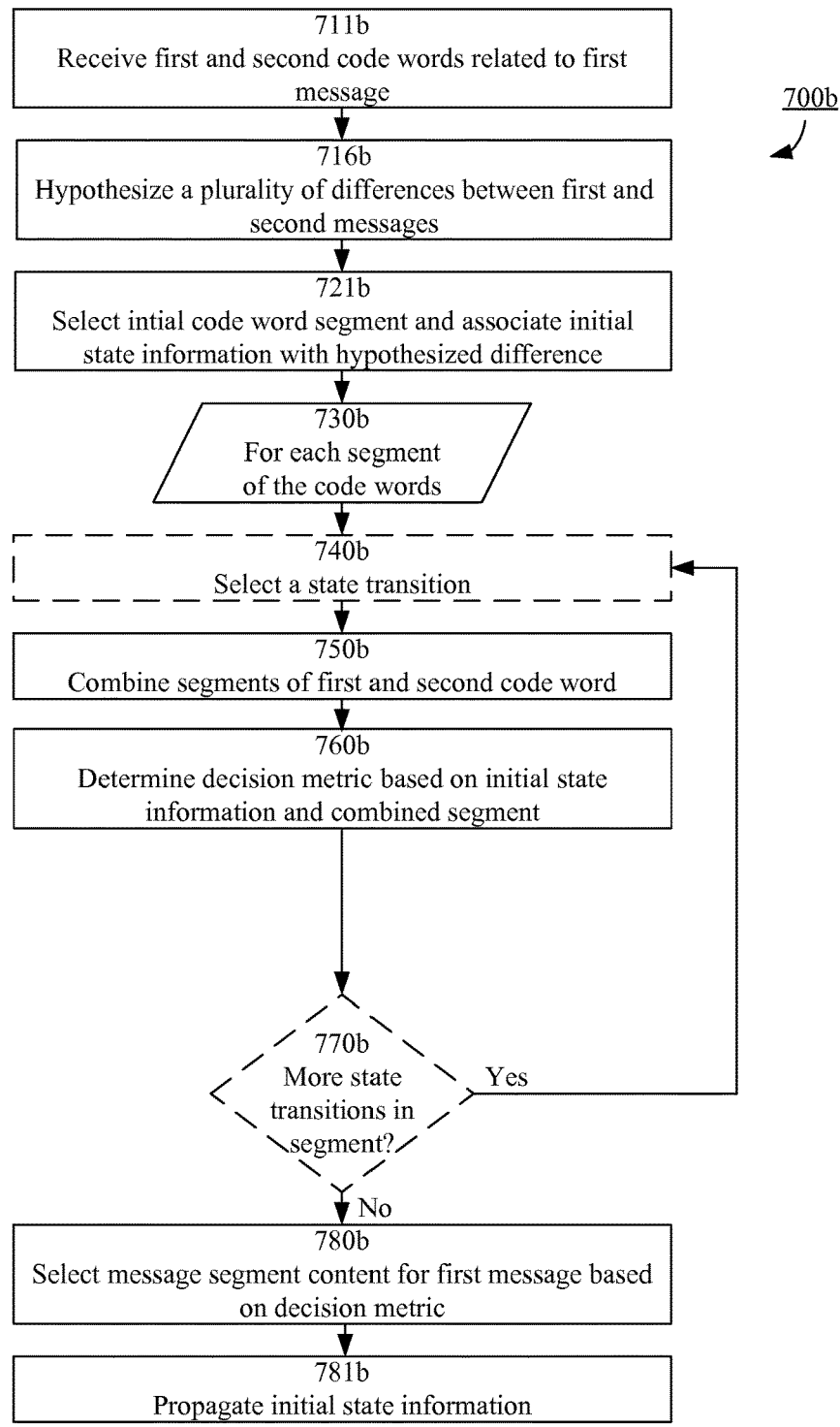
FIG. 7B is a flowchart illustrating example method steps according to some embodiments.

In relation to FIG. 7B, an example method 700b (performed by a communication device) of decoding a first message will now be described, wherein the first message and a second message are encoded by a code to produce a first code word and a second code word, respectively. The code is represented as a state machine, wherein a state transition of the state machine has a previous state and a subsequent state and is associated with a corresponding segment of the code word.

The first and second code words are received in step 711b as distorted over a communication channel. Typically, the first and second code words are received with some interval of time there between.

A plurality of differences between the first message and the second message are hypothesized in step 716b, and an initial code word segment is selected in step 721b wherein each initial code word segment has one (or more) initial states as associated previous state. Each hypothesized difference corresponds to a hypothesized value of a part of the first message, each of the initial states is associated with a corresponding one of the hypothesized differences and is uniquely defined by the respective hypothesized value of the part of the first message.

Decoding of the first message comprises performing the following steps for each code word segment of the received first code word (starting with the initial code word segment), as illustrated by 730b:

Step 750b: combining the code word segment of the received first code word with a transformed code word segment of the received second code word to produce a combined code word segment, wherein the code word segment of the received second code word is transformed based on the hypothesized difference of the initial state associated with the previous state of the state transition corresponding to a first message segment content.

Step 760: determining a decision metric associated with a probability that the combined code word segment corresponds to the first message segment content.

Typically (e.g. in a Viterbi decoding algorithm), the above two steps may be iterated for all state transitions in the code word segment under consideration before the following steps are performed for the code word segment under consideration. This is illustrated by the loop controlled by 740*b* and 770*b* in FIG. 7B.

Step 780*b*: selecting, for the first message, the first message segment content or a second message segment content based on the decision metric.

Step 781*b*: propagating the initial state information based on the selected message segment content. If the first message segment content is selected, the initial state associated with the previous state of the state transition corresponding to the first message segment content is associated with the subsequent state of that state transition, and correspondingly if the second message segment content is selected.

Figure 8A:
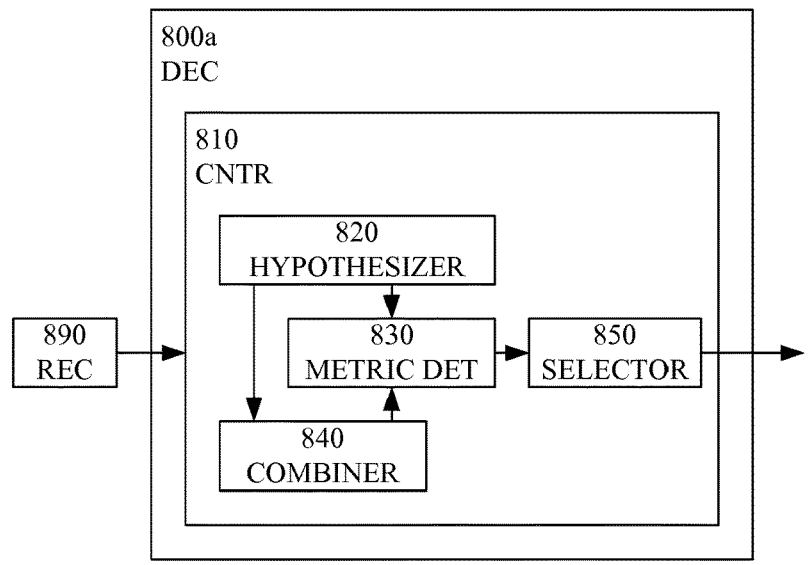
FIG. 8A is a schematic block diagram illustrating an example arrangement according to some embodiments.

FIG. 8A schematically illustrates an example decoder (DEC) 800*a* according to some embodiments. The decoder 800*a* may, for example, be adapted to perform method steps as described in connection to any of the FIGS. 6A, 6C and 7B.

The decoder 800*a* may be comprised in a communication device together with a receiver (REC) 890 and may be adapted to decode a first message (and possibly a second message).

The first and second messages are encoded by a code to produce a first code word and a second code word, respectively. The encoding is typically performed by another device, which transmits the first and second code words to the device comprising the decoder 800*a*. The code is represented as a state machine, wherein a state transition of the state machine has a previous state and a subsequent state and is associated with a corresponding segment of the code word. The first and second code words are received by the receiver 890 as distorted over a communication channel.

The decoder comprises a controller (CNTR) 810 adapted to hypothesize a difference or a plurality of differences between the first message and the second message and decode the first message. When a plurality of differences is hypothesized, each hypothesized difference corresponds to a hypothesized value of a part of the first message.

The controller 810 is adapted to decode the first message by (for each code word segment of the received first code word starting with an initial code word segment) determining a decision metric based on a combined code word segment as described above, and selecting (for the first message) a message segment content based on the decision metric. The decoded first message is output from the controller 810 for possible further processing.

The decoder 800*a* may comprise a hypothesizer 820 adapted to hypothesize the difference(s), a combiner 840 adapted to combine the code word segments, a metric determiner (METRIC DET) 830 adapted to determine the decision metric, and a selector 850 adapted to select the message segment content based on the decision metric.

The controller is also adapted to select the initial code word segment (having a plurality of initial states as associated previous states) wherein each of the initial states is associated with a corresponding one of the hypothesized differences and is uniquely defined by the respective hypothesized value of the part of the first message. A selector of the decoder 800*a* (which may be the same of different from the selector 850) may be adapted to select the initial code word segment.

The controller may also be adapted to propagate the initial state information based on the selection of message segment content as described above.

Figure 8B:
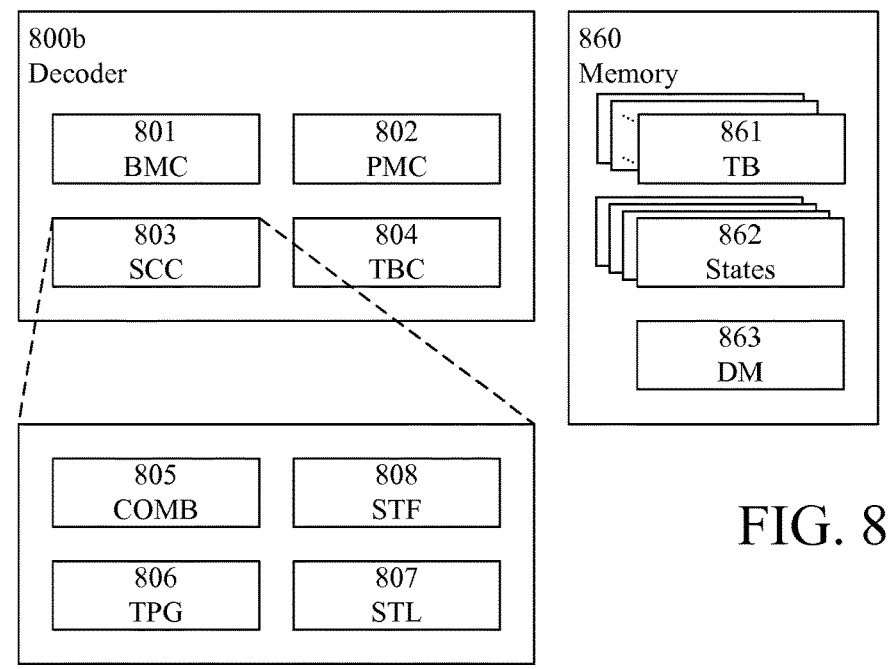
FIG. 8B is a schematic block diagram illustrating an example arrangement including a decoder according to some embodiments.

A block diagram of an example decoder is shown in FIG. 8B. The apparatus comprises two parts: a Decoder (800*b*) and a Memory (860).

The Decoder 800*b* may comprise four blocks/units:

A Branch Metric unit (Branch Metrics Circuitry—BMC) 801, which calculates the branch metrics (compare with 830 of FIG. 8A).

A Symbol Combiner unit (Symbol Combiner Circuitry—SCC) 803, which combines code symbols from different MIB instances into one for each of four SFN ranges by translating states between the MIB instances and transforming the code symbols (compare with 840 of FIG. 8A), further comprising A Combiner (COMB) 805 carrying out the soft combining of symbols, A Toggle pattern generator (TPG) 806, which generates the toggle patterns, A State Translator (STL) 807 which extracts the relevant part of a toggle pattern to be used for translation of states for a particular bit being processed, and A Symbol Transformer (STF) 808 which determines differences between branch words and transforms the code symbol correspondingly.

A Path Metrics unit (Path Metrics Circuitry—PMC) 802, calculating path metrics based on branch metrics, comparing path metrics of candidate branches, selecting which branch to keep and keeping record of which initial state (or toggle pattern, or SFN) a selected branch is associated with (compare with 850 of FIG. 8A).

A Traceback unit (Traceback Circuitry—TBC) 804, which traces back the states traversed and converts it into information bits.

The Memory 860 may comprise:

Memory partitions for storage of rate restored transport blocks of 40 code symbols (120 bits) represented as hard or soft bits, and information on the time of acquisition; Transport Block (TB) 861, Four (or any suitable number of) state memory partitions—one for each SFN range—where path metrics, associated initial state (or toggle pattern or SFN), previous state and such information is stored; States 862, and A memory partition for the decoded message (DM) 863.

Figure 9:
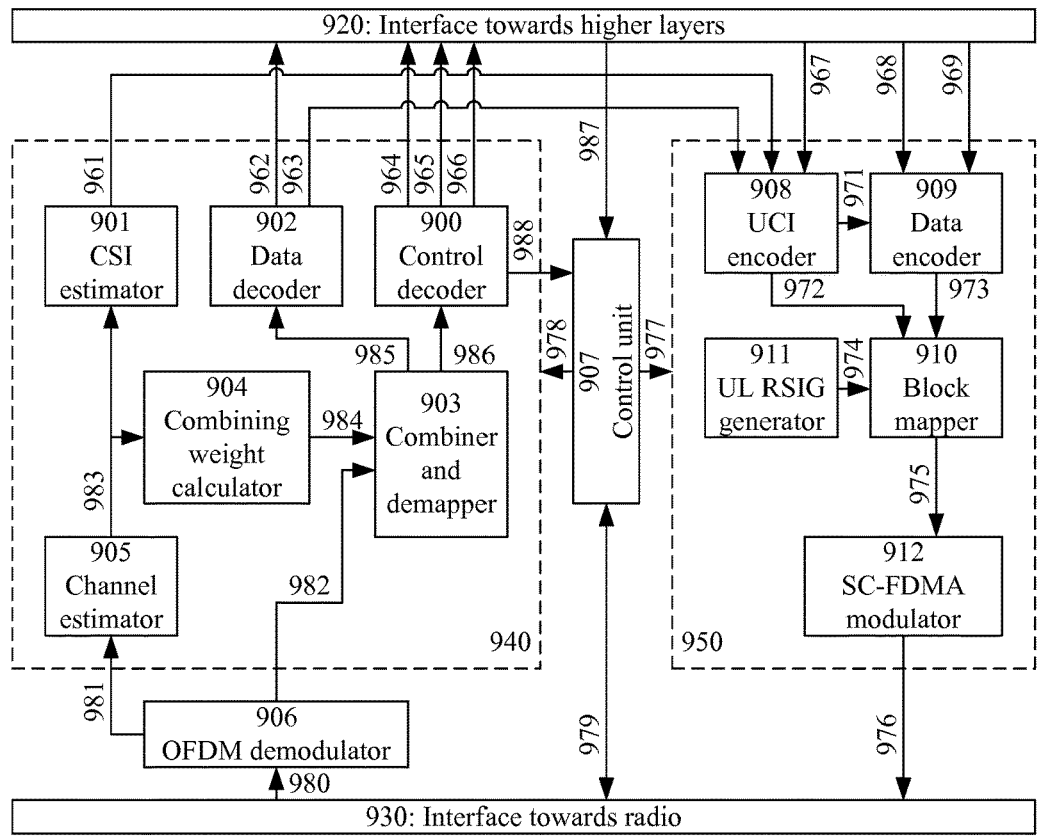
FIG. 9 is a schematic block diagram illustrating an example arrangement according to some embodiments.

FIG. 9 may be used to describe physical layer processing and illustrates an example subsystem where some embodiments can be used. The embodiments may be used/operating in the Control decoder 900.

A simplified sketch of the LTE physical layer in a UE is provided in FIG. 9. The description below relates to legacy releases of LTE, and some details may differ for a UE where aspects of the idea are implemented, for example in an MTC UE supporting operation in enhanced coverage. For example, this may relate to the physical channels the UE is expected to receive, or reporting procedures. This does not impose a limitation of how and where the invention is used.

Samples are received from the radio at 980 (via the interface towards radio 930), and subjected to an FFT in the OFDM demodulator 906. The output from the OFDM demodulator 906 comprises resource elements carrying e.g. modulation symbols 982 and reference signals 981. The reference signals 981 are used by the Channel estimator 905 for estimating the radio channel. From the channel estimates 983 and from information on transmission mode and allocated bandwidth the (preferably optimum) combining weights 984 are derived by the Combining weight calculator 904. Some reference signals 981 and/or channel estimates 983 are also used by the CSI estimator 901 for calculating channel state information (CSI 961, including CQI) which is fed back to the network node. Received modulation symbols 982 and combining weights 984 are fed to the Combiner and demapper 903 which produces soft bits (data soft bits 985 and/or control soft bits 986), which are input to either of the decoders 902, 900, depending on channel (data soft bits to the data decoder 902 and control soft bits to the control decoder 900).

The UE first receives and decodes PDCCH (physical downlink control channel) to find downlink control information (DCI) providing information on allocations on PDSCH (physical downlink shared channel) as well as the transmission mode and modulation and coding scheme (MCS) in use, uplink allocations (scheduling grant; SG), uplink power control commands, etc. However before receiving it the UE decodes the physical control format indicator channel (PCFICH) which tells how large the control region is, i.e., how many of the initial OFDM symbols in the subframe are carrying PDCCH. Also, before the decoding the radio propagation channel needs to be estimated and combining weights be produced.

PDCCH is convolutional encoded and is decoded by the Control decoder 900. The decoded DCI 988 is fed to the Control unit 907 which is used for configuring the baseband and communicates with the radio via radio control signals 979 and the interface toward radio 930. The Control decoder 90 further outputs feedback from the network node on whether transmissions on the uplink were successfully decoded or not (UL ACK/NACK; UL A/N 964), and is also used for decoding the master information block (MIB) carried on PBCH (physical broadcast channel).

Once the DCI has been decoded, generally at a point in time about in the middle of the subframe, the PDSCH is next. Remaining reference signals in the subframe are used for improving the channel estimates, combining weights are tailored for the transmission mode in use, and then the received modulation symbols are combined and demapped, resulting in soft bits to be subjected to decoding. Since the whole subframe has to be received before the decoding can start, timing-wise this happens in the following subframe, in a pipelined fashion, while control information is received and decoded.

PDSCH is turbo encoded and it is decoded using the Data decoder 902 which mainly comprises hybrid automatic request (HARQ) functionality with associated soft bit combiner, and a turbo decoder. The turbo decoder iterates the decoding until the received data is successfully decoded (as indicated by a successful cyclic redundancy check; CRC) or until running out of time (iterations). In case of failure to decode it may give up earlier if metrics indicate that not much more information is corrected in subsequent iterations, so called early give-up function (EGF). Due to the pipelined fashion of processing the turbo decoder has to finish within the duration of one subframe. Feedback on whether data was successfully decoded or not (ACK/NACK; DL A/N 963) is provided to the network node in subframe n+4, where subframe n is the subframe where the data was received.

The CSI reporting may be either periodical, by which the UE knows beforehand when it is to be reported, but may also be aperiodical by which the UE gets informed in the DCI that a CSI report is to be sent in subframe n+4.

The processing time for the OFDM demodulator, Channel Estimator, Combining weight calculator, Combiner and demapper, and Control decoder is highly dependent on the bandwidth in use, whereas the processing time for the Data decoder mainly depends on the UE category which is dictating the size of the HARQ buffers.

When the UE has received an SG 965 in subframe n, it is to transmit on the physical uplink shared channel (PUSCH) in subframe n+4. Scheduling requests (SR) 967, DL A/N 963, and CSI 961 constitute the uplink control information (UCI) which is encoded by the UCI encoder 908. Data to be transmitted is encoded by the Data encoder 909 which carriers out Turbo encoding, and then UCI 971 is inserted. The modulation symbols are fed to the Block mapper 910, which maps the modulation symbols and uplink reference symbols, produced by UL RSIG generator 911, to the granted allocation. The resulting sequences of symbols (modulation symbols 975) are fed to the SC-FDMA modulator 912 which essentially carries out an IFFT, and the output is sent to the radio (samples to radio 976 via the interface towards radio 930).

In case no scheduling grant 965 is received but the UE is to provide UL A/N 964, CSI 961 and SR 967, the information is transmitted on the physical uplink control channel (PUCCH) 972 according to a predefined format.

The processing time for UL RSIG generator, Block mapper, and SC-FDMA modulator is highly dependent on the bandwidth in use, whereas the processing time for Data encoder is depending on the UE category.

Further, due to timing advance (TA) 987 and the standard stipulating that cell radius up to 100 km shall be supported, the uplink subframe n may have to be transmitted 0.67 ms before downlink subframe n has been received. Hence the UE will have to be able to do all data- and CSI-related processing of a subframe within roughly 2 ms, to meet the times for DL A/N, acting on aperiodic CSI reporting requests, acting on UL A/N from network node, etc.

The interface towards higher layers 920 receives the uplink ACK/NACK 964, the scheduling grant (SG) 965, information of the broadcast channel (BCH) 966 and information of the downlink shared channel and/or multicast channel (DL-SCH/MCH) 962. The interface towards higher layers 920 provides the scheduling request (SR) 967, information for the uplink shared channel (UL-SCH) 968, and the modulation and coding scheme (MCS) 969.

It may be noted that due to cost and power effectiveness a UE may generally be designed with just the processing capacity, memory size, etc needed for the supported features and capabilities, e.g. number of DL and UL carriers, respectively, and supported bandwidth for each of them. This is reflected e.g. by that the FFTs and IFFTs are designed to meet the deadlines on OFDM symbol basis, but not much quicker.

One or more of the following features may be comprised in some example embodiments:

1. A device configured to receive and decode a message that is repeated at least twice, where the at least two repetitions differ by at least one information bit, and where the difference between the repetitions is known (or hypothesized) although the content of the messages is unknown, where the device:
   a. Receives a first repetition of the encoded message over a link,
   b. Restores the rate of the first repetition of the encoded message,
   c. Attempts to decode first received repetition of the encoded message
   d. Fails to decode first received repetition(s) of the encoded message, and receives at least a second repetition of the encoded message, whereby it attempts to simultaneously decode the two or more received repetitions;
      i. Deriving which information bits and CRC check sum bits (if any) that will differ between the repetitions ii. Using said information to link the decoding of the first repetition to any of the other repetitions iii. Basing the decisions in the decoding on the joint information for the at least two repetitions 2. As described in 1 where joint information represents path metrics in a Viterbi decoder, and where the path metrics related to different output bits for different repetitions are related to each other through the derived information on which information and CRC bit(s) will differ
3. As described in 1 and 2 where the device is a wireless device (UE/MTC) and where the repetition represents MIBs from different 40 ms periods and the difference in information bits is a SFN counter value, and the difference in CRC bits is a consequence of the change in SFN counter value.
4. As described in 1-3 where decoding the messages in the at least two repetitions is done separately, i.e., outputting at least two MIBs
5. As described in 1-3 where decoding only one message, but utilizing information from the repetitions in the decoding of first message.
6. As described in 1 where instead of translating states and input orders, the code words are systematically transformed such that for instance all received repetitions undergoing decoding follow the same path through the trellis.

Some further advantages and benefits of some embodiments, in terms of reduced number of decoding attempts and/or reduced need for repetitions of the MIB will now be elaborated on.

In a first example, a wireless device (UE, mobile station, mobile terminal, laptop, USB, embedded device, machine type communication (MTC) or M2M capable, D2D capable UE aka proximity service (ProSe) UE etc.) performing MIB acquisition can shorten the acquisition time by allowing combining PBCH blocks, carrying the MIB, to be combined across 40 ms TTI barriers, for cases when more than one PBCH block is needed for successfully decoding the MIB and the acquisition starts in a part of the 40 ms TTI where not sufficient number of PBCH blocks can be captured before crossing the boundary to the next 40 ms TTI.

Figure 3:
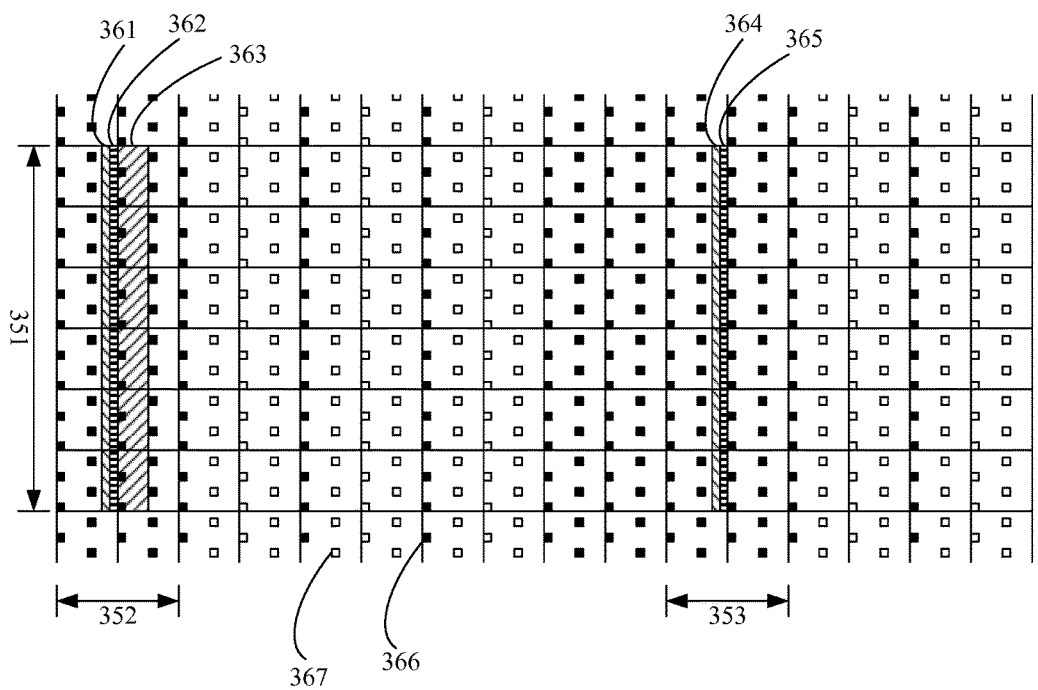
FIG. 3 is a schematic drawing illustrating location of PBCH in a time-frequency resource grid according to some embodiments.

This example illustrates benefits with some embodiments in MIB decoding for legacy use cases, and it is assumed that each TTI contains 4 PBCH blocks (each comprising a MIB) located in the radio frames as described in connection with FIG. 3 and, hence, equidistantly distributed in the 40 ms PBCH TTI.

If the propagation conditions are such that 1 PBCH block is needed for successful decoding, approaches described herein will perform equally well as approaches according to the prior art.

If the propagation conditions are such that 2 PBCH blocks are needed for successful decoding, approaches described herein result in successful decoding as soon as any 2 PBCH blocks have been received, while approaches according to the prior art that cannot combine PBCH blocks from different TTIs may not be able to achieve successful decoding until 3 PBCH blocks have been received if the first received PBCH block was the last one of a TTI (worst case scenario).

If the propagation conditions are such that 3 PBCH blocks are needed for successful decoding, approaches described herein result in successful decoding as soon as any 3 PBCH blocks have been received, while approaches according to the prior art that cannot combine PBCH blocks from different TTIs may not be able to achieve successful decoding until 5 PBCH blocks have been received if the second received PBCH block was the last one of a TTI (worst case scenario).

If the propagation conditions are such that 4 PBCH blocks are needed for successful decoding, approaches described herein result in successful decoding as soon as an, 4 PBCH blocks have been received, while approaches according to the prior art that cannot combine PBCH blocks from different TTIs may not be able to achieve successful decoding until 7 PBCH blocks have been received if the third received PBCH block was the last one of a TTI (worst case scenario).

In a second example, repetition of PBCH (or MIB) as discussed in the standardization (e.g. for low-cost MTC enhanced coverage use cases) is considered. Besides one PBCH block in each radio frame (as in the first example), three duplicates are provided (illustratively in subframes 4, 5 and 9, located similarly as in subframe 0—compare with FIG. 3). Thus, each message is repeated 4 times to improve the decoding sensitivity by 6 dB.

In case the radio conditions are such that a wireless device would need all 16 blocks that are transmitted during a 40 ms TTI, the wireless device has to continue to collect PBCH blocks and attempt decoding until it has managed to capture 16 blocks from the same 40 ms TTI. In some embodiments, it may be enough to collect any 16 PBCH blocks regardless of from which TTI they come, while approaches according to the prior art that cannot combine PBCH blocks from different TTIs may not be able to achieve successful decoding until 31 PBCH blocks have been received if the 15th received PBCH block was the last one of a TTI (worst case scenario). Hence, the acquisition time and the overall effort in radio usage and processing can be reduced.

This repetition pattern of this second example is used for illustrational purposes only. Other repetition patterns may be equally applicable. For example, in 3GPP Release 13 the network can optionally decide to repeat PBCH using a repetition pattern where the PBCH blocks are not only repeated in additional subframes, but additionally the four individual OFDM symbols constituting each PBCH block are also repeated within these subframes. The exact repletion pattern does not change the applicability of embodiments herein, but merely relates to how PBCH data is received and stored, e.g. referring to steps 602*a* and 603*a* in FIG. 6A In a third example, an example is considered where the radio conditions are such that 16 PBCH blocks are needed for successful decoding (corresponding to 6 dB improvement in decoder sensitivity), but no additional repetitions of PBCH (or MIB) are provided (compare with the first example).

Approaches described herein result in successful decoding as soon as any 16 PBCH blocks have been received (which is after 4 TTIs have been received if the first received PBCH block was the first one of a TTI), while approaches according to the prior art that cannot combine PBCH blocks from different TTIs may not be able to achieve successful decoding at all. Thus, without application of embodiments described herein it is virtually impossible in this example to decode the MIB, whereas with application of embodiments described herein it is just a matter of collecting 16 PBCH blocks and carrying out decoding.

Comparing the third example with the second example also shows that PBCH repetition for low-cost MTC enhanced coverage can be avoided, meaning that system capacity can be saved.

To summarize, in all cases except when radio conditions are such that a single PBCH block is enough for successfully decoding the MIB, there are benefits with application of embodiments described herein.

The benefits are both for the wireless device (less radio time to acquire a MIB yields lower power consumption) and the network node (less repetitions needed yields more system capacity for other users or for more robust dedicated transmissions).

The described embodiments and their equivalents may be realized in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, or by specialized circuits such as for example application-specific integrated circuits (ASIC). All such forms are contemplated to be within the scope of this disclosure.

Embodiments may appear within an electronic apparatus (such as a communication device) comprising circuitry/logic or performing methods according to any of the embodiments. The electronic apparatus may, for example, be a portable or handheld mobile radio communication equipment, a mobile radio terminal, a mobile telephone, a communicator, an electronic organizer, a smartphone, a computer, a notebook, or a mobile gaming device. Alternatively or additionally, the electronic apparatus may be, for example, a wireless sensor or another type of device for machine-type communication (MTC) and/or machine-to-machine (M2M) communication.

Figure 10:
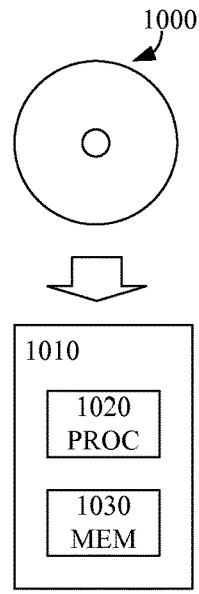
FIG. 10 is a schematic drawing illustrating a computer readable medium according to some embodiments.

According to some embodiments, a computer program product comprises a computer readable medium such as, for example, a USB-stick, a plug-in card, an embedded drive, a diskette or a CD-ROM (exemplified by 1000 in FIG. 10. The computer readable medium may have stored thereon a computer program comprising program instructions. The computer program may be loadable into a data-processing unit (PROC) 1020, which may, for example, be comprised in a communication device 1010. When loaded into the data-processing unit 1020, the computer program may be stored in a memory (MEM) 1030 associated with or integral to the data-processing unit 1020. According to some embodiments, the computer program may, when loaded into and run by the data-processing unit, cause the data-processing unit to execute method steps according to, for example, the methods shown in any of the FIGS. 6A, 6B, 6C, 7A and 7B.

Figure 11:
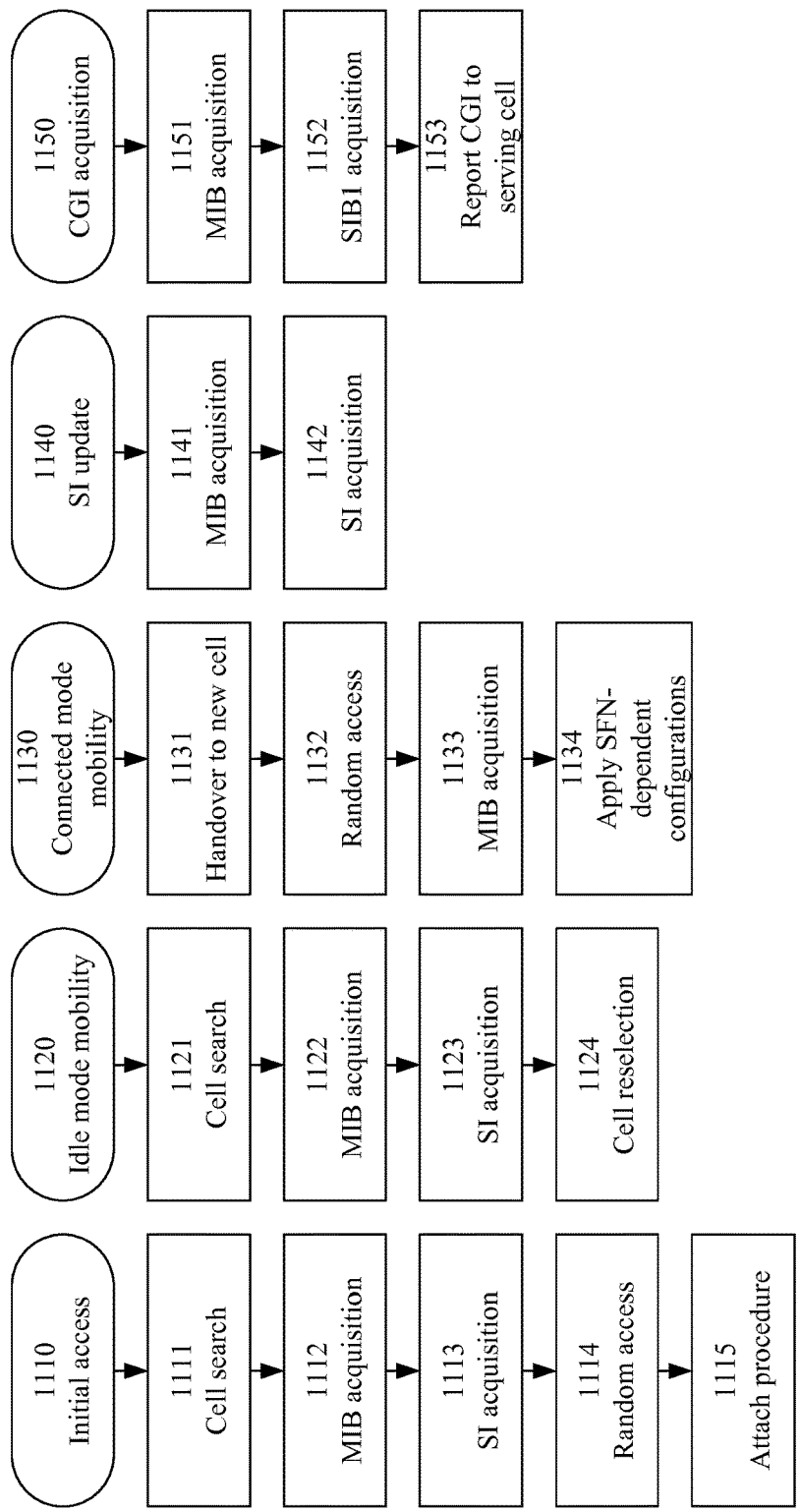
FIG. 11 is an illustration of use cases for MIB acquisition according to some embodiments.

FIG. 11 may be described as illustrating five non-limiting examples (use cases) of MIB acquisition:
Initial access (cell selection),
Idle mode mobility (cell reselection),
Connected mode mobility (handover),
SI update; and
CGI acquisition (Closed subscriber group (CSG) mobility, Self-organizing networks (SON)/Automatic neighbor relations (ANR))

In initial access the device is searching for a first cell to make network attach to. Once a cell has been detected by means of detecting synchronization signals, the device reads the MIB to get information on DL bandwidth and PHICH configuration in use, and the current system frame number. With this information the device can tune its radio receiver to the correct bandwidth and start receiving system information which carries the information needed for the device to perform a random access towards the cell, and further, to do an attach to the particular network to which the cell belongs.

In idle mode mobility the device is detecting neighbor cells on carriers signaled by the network via system information. When it encounters a cell that is received with better strength and/or quality than the current serving cell, the device evaluates it for reselection. Acquisition of MIB and particular system information is part of the evaluation procedure to verify that the device is allowed to camp on that particular cell, and also, whether that particular cell belongs to the same tracking area as the current serving cell; if not, the device additionally has to carry out a tracking area update procedure (not illustrated).

In connected mode mobility the device has detected and reported the cell to the network, whereby it has received a handover command (RRC radio resource reconfiguration) which specifies that the device shall switch serving cell to the specified one. Most of the essential information is provided to the device already in the handover command hence it can immediately carry out random access, but some configurations (e.g. discontinuous reception (DRX) configurations) can only be applied after the device has acquired SFN. Therefore the UE reads the MIB and then applies those configurations that require knowledge of the SFN.

In SI update the device gets paged about that system information is to be updated in the serving cell, whereby it has to read MIB and SIB1, and if indicated in SIB1, further SIBs that have been modified. SI update can also be triggered by one or more timers, keeping track of age of the acquired system information, have expired.

In CGI acquisition the device has detected and reported a cell to the network, by which it receives a measurement configuration that states that it is to determine the global cell identity (CGI) of the reported cell. The device reads MIB and SIB1 of the detected cell, and reports the CGI to the serving cell.

Figure 12:
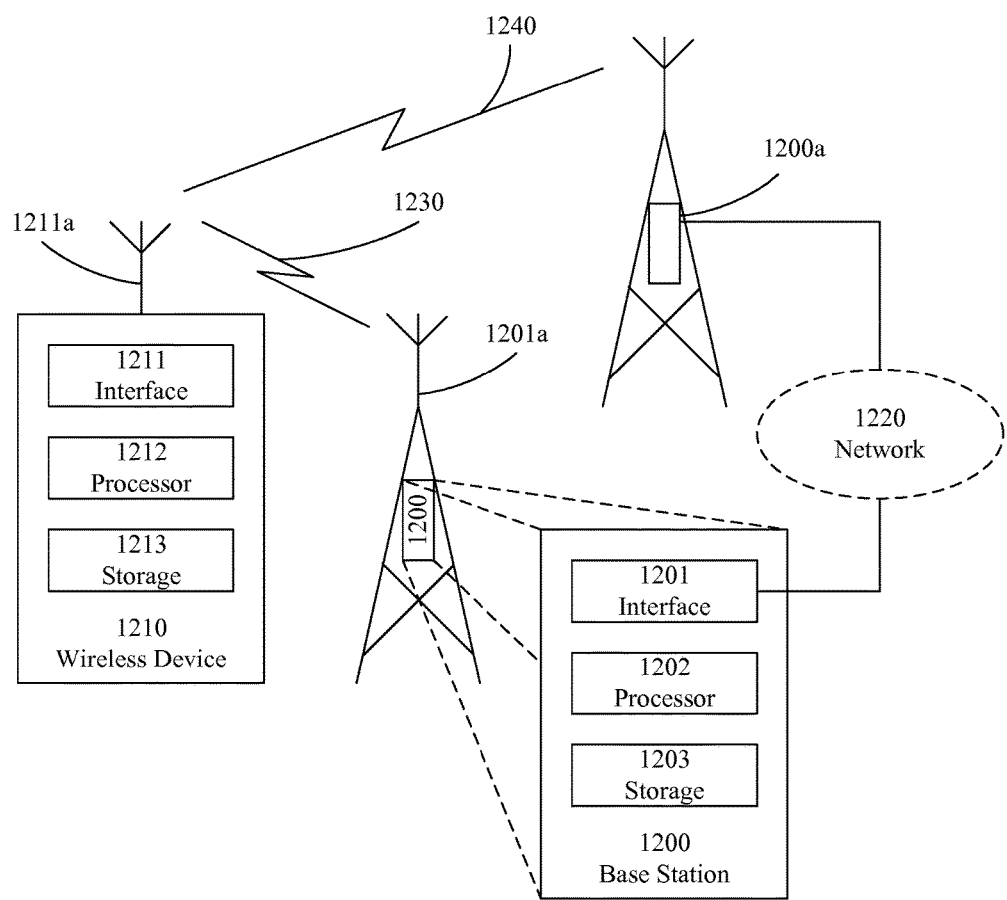
FIG. 12 is a schematic illustration of a wireless network where some embodiments may be applied.

FIG. 12 illustrates a wireless network comprising a more detailed view of a network node 1200 and a wireless device (WD) 1210, in accordance with some embodiments. For simplicity, FIG. 12 only depicts network 1220, network nodes 1200 and 1200*a*, and WD 1210. Network node 1200 comprises processor 1202, storage 1203, interface 1201, and antenna 1201*a*. Similarly, WD 1210 comprises processor 1212, storage 1213, interface 1211 and antenna 1211*a*. These components may work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components that may facilitate or participate in the communication of data and/or signals whether via wired or wireless connections.

Network 1220 may comprise one or more IP networks, public switched telephone networks (PSTNs), packet data networks, optical networks, wide area networks (WANs), local area networks (LANs), wireless local area networks (WLANs), wired networks, wireless networks, metropolitan area networks, and other networks to enable communication between devices.

Network node 1200 comprises processor 1202, storage 1203, and interface 1201. These components are depicted as single boxes located within a single larger box. In practice however, a network node may comprises multiple different physical components that make up a single illustrated component (e.g., interface 1201 may comprise terminals for coupling wires for a wired connection and a radio transceiver for a wireless connection). Similarly, network node 1200 may be composed of multiple physically separate components (e.g., a NodeB component and a RNC component, a BTS component and a BSC component, etc.), which may each have their own respective processor, storage, and interface components. In certain scenarios in which network node 1200 comprises multiple separate components (e.g., BTS and BSC components), one or more of the separate components may be shared among several network nodes. For example, a single RNC may control multiple NodeB's. In such a scenario, each unique NodeB and BSC pair, may be a separate network node. In some embodiments, network node 1200 may be configured to support multiple radio access technologies (RATs). In such embodiments, some components may be duplicated (e.g., separate storage 1203 for the different RATs) and some components may be reused (e.g., the same antenna 1201*a* may be shared by the RATs).

Processor 1202 may be a combination of one or more of a microprocessor, controller, microcontroller, central processing unit, digital signal processor, application specific integrated circuit, field programmable gate array, or any other suitable computing device, resource, or combination of hardware, software and/or encoded logic operable to provide, either alone or in conjunction with other network node 200 components, such as storage 1203, network node 1200 functionality. For example, processor 1202 may execute instructions stored in storage 1203. Such functionality may include providing various wireless features discussed herein to a wireless devices, such as WD 1210, including any of the features or benefits disclosed herein.

Storage 1203 may comprise any form of volatile or non-volatile computer readable memory including, without limitation, persistent storage, solid state memory, remotely mounted memory, magnetic media, optical media, random access memory (RAM), read-only memory (ROM), removable media, or any other suitable local or remote memory component. Storage 1203 may store any suitable instructions, data or information, including software and encoded logic, utilized by network node 1200. Storage 1203 may be used to store any calculations made by processor 1202 and/or any data received via interface 1201.

Network node 1200 also comprises interface 1201 which may be used in the wired or wireless communication of signaling and/or data between network node 1200, network 1220, and/or WD 1210. For example, interface 1201 may perform any formatting, coding, or translating that may be needed to allow network node 1200 to send and receive data from network 1220 over a wired connection. Interface 1201 may also include a radio transmitter and/or receiver that may be coupled to or a part of antenna 1201*a*. The radio may receive digital data that is to be sent out to other network nodes or WDs via a wireless connection. The radio may convert the digital data into a radio signal having the appropriate channel and bandwidth parameters. The radio signal may then be transmitted via antenna 1201*a* to the appropriate recipient (e.g., WD 1210).

Antenna 1201*a* may be any type of antenna capable of transmitting and receiving data and/or signals wirelessly. In some embodiments, antenna 1201*a* may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line.

WD 1210 may be any type of wireless endpoint, mobile station, mobile phone, wireless local loop phone, smartphone, user equipment, desktop computer, PDA, cell phone, tablet, laptop, VoIP phone or handset, which is able to wirelessly send and receive data and/or signals to and from a network node, such as network node 1200 and/or other WDs. WD 1210 comprises processor 1212, storage 1213, interface 1211, and antenna 1211*a*. Like network node 1200, the components of WD 1210 (excluding the antenna 1211*a*) are depicted as single boxes located within a single larger box, however in practice a wireless device may comprises multiple different physical components that make up a single illustrated component (e.g., storage 1213 may comprise multiple discrete microchips, each microchip representing a portion of the total storage capacity).

Processor 1212 may be a combination of one or more of a microprocessor, controller, microcontroller, central processing unit, digital signal processor, application specific integrated circuit, field programmable gate array, or any other suitable computing device, resource, or combination of hardware, software and/or encoded logic operable to provide, either alone or in combination with other WD 1210 components, such as storage 1213, WD 210 functionality. Such functionality may include providing various wireless features discussed herein, including any of the features or benefits disclosed herein.

Storage 1213 may be any form of volatile or non-volatile memory including, without limitation, persistent storage, solid state memory, remotely mounted memory, magnetic media, optical media, random access memory (RAM), read-only memory (ROM), removable media, or any other suitable local or remote memory component. Storage 1213 may store any suitable data, instructions, or information, including software and encoded logic, utilized by WD 1210. Storage 1213 may be used to store any calculations made by processor 1212 and/or any data received via interface 1211.

Interface 1211 may be used in the wireless communication 1230, 1240 of signaling and/or data between WD 1210 and network node 1200 and/or network node 1200*a*. For example, interface 1211 may perform any formatting, coding, or translating that may be needed to allow WD 1210 to send and receive data from network node 1200 over a wireless connection. Interface 1211 may also include a radio transmitter and/or receiver that may be coupled to or a part of antenna 1211*a*. The radio may receive digital data that is to be sent out to network node 1201 via a wireless connection. The radio may convert the digital data into a radio signal having the appropriate channel and bandwidth parameters. The radio signal may then be transmitted via antenna 1211*a* to network node 1200.

Antenna 1211*a* may be any type of antenna capable of transmitting and receiving data and/or signals wirelessly. In some embodiments, antenna 1211*a* may comprise one or more omni-directional, sector or panel antennas operable to transmit/receive radio signals between 2 GHz and 66 GHz. For simplicity, antenna 1211*a* may be considered a part of interface 1211 to the extent that a wireless signal is being used.

In some embodiments, the components described above may be used to implement one or more functional modules used in decoding of messages with known (or hypothesized) difference. The functional modules may comprise software, computer programs, sub-routines, libraries, source code, or any other form of executable instructions that are run by, for example, a processor. In general terms, each functional module may be implemented in hardware and/or in software. One or more or all functional modules may be implemented by processors 1212 and/or 1202, possibly in cooperation with storage 1213 and/or 1203. Processors 1212 and/or 1202 and storage 1213 and/or 1203 may thus be arranged to allow processors 1212 and/or 1202 to fetch instructions from storage 1213 and/or 1203 and execute the fetched instructions to allow the respective functional module to perform any features or functions disclosed herein. The modules may further be configured to perform other functions or steps not explicitly described herein but which would be within the knowledge of a person skilled in the art.

Certain aspects of the inventive concept have mainly been described above with reference to a few embodiments. However, as is readily appreciated by a person skilled in the art, embodiments other than the ones disclosed above are equally possible and within the scope of the inventive concept. Similarly, while a number of different combinations have been discussed, all possible combinations have not been disclosed. One skilled in the art would appreciate that other combinations exist and are within the scope of the inventive concept. Moreover, as is understood by the skilled person, the herein disclosed embodiments are as such applicable also to other standards and communication systems and any feature from a particular figure disclosed in connection with other features may be applicable to any other figure and or combined with different features.

Reference has been made herein to various embodiments. However, a person skilled in the art would recognize numerous variations to the described embodiments. For example, the method embodiments described herein describes example methods through method steps being performed in a certain order. However, it is recognized that these sequences of events may take place in another order. Furthermore, some method steps may be performed in parallel even though they have been described as being performed in sequence.

In the same manner, it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims.

Hence, it should be understood that the details of the described embodiments are merely for illustrative purpose and by no means limiting. Instead, all variations that fall within the range of the claims are intended to be embraced therein.

Some keywords that may be applicable to some embodiments comprise: System throughput, UE, Tail-biting convolutional encoding, Circular Viterbi decoder, path metrics, branch metrics, soft combining, trace-back, trellis, code word, LTE, master information block (MIB), physical broadcast channel (PBCH), physical layer, machine-to-machine (M2M) communication, machine type communication (MTC), low-cost MTC (LC-MTC), MTC enhanced coverage (MTC-EC, LC-MTC-EC).

| Abbreviation | Explanation |
| --- | --- |
| ACK | Acknowledged |
| ACS | Add/Compare/Select unit |
| BCCH | Broadcast control channel |
| BMU | Branch metrics unit |
| CQI | Channel quality indicator |
| CRC | Cyclic redundancy check |
| CRS | Cell-specific reference signals |
| CSI | Channel state information |
| CVA | Circular Viterbi algorithm (for tail biting code) |
| DCI | Downlink control information |
| DL | Downlink |
| EGF | Early give-up function |
| FDD | Frequency division duplex |
| FDMA | Frequency division multiple access |
| FFT | Fast Fourier transform |
| HARQ | Hybrid automatic repeat request |
| IFFT | Inverse FFT |
| LC-MTC | Low cost MTC device |
| LC-MTC-EC | Low cost MTC device with enhanced coverage |
| LSB | Least significant bit |
| LTE | Long term evolution |
| MBSFN | Multicast broadcast single frequency network |
| MCS | Modulation and coding scheme |
| MIB | Master information block |
| MSB | Most significant bit |
| MTC | Machine type communication |
| MTC-EC | MTC enhanced coverage |
| NACK | Not acknowledged |
| OFDM | Orthogonal frequency division duplex |
| PBCH | Physical broadcast channel |
| PCFICH | Physical control format indicator channel |
| PDCCH | Physical downlink control channel |
| PDSCH | Physical downlink shared channel |
| PHICH | Physical HARQ indicator channel |
| PMU | Path metric unit |
| PSS | Primary synchronization channel |
| PUCCH | Physical uplink control channel |
| PUSCH | Physical uplink shared channel |
| QAM | Quadrature amplitude modulation |
| QPSK | Quadrature phase shift keying |
| RAT | Radio access technology |
| RSIG | Reference signals (e.g. CRS) |
| RV | Redundancy version |
| SC-FDMA | Single carrier FDMA |
| SFN | System frame number |
| SG | Scheduling grant |
| SI | System Information |
| SIB | System information block |
| SINR | Signal-to-Interference and Noise Ratio |
| SNR | Signal-to-Noise Ratio |
| SR | Scheduling request |
| SSS | Secondary synchronization signal |
| TA | Timing advance |
| TBU | Trace-back unit |
| TDD | Time division duplex |
| TTI | Transmission time interval |
| UCI | Uplink control information |
| UE | User equipment |
| UL | Uplink |
| VA | Viterbi algorithm |
| XOR | Exclusive OR (symbol $\oplus$) |

The invention claimed is:

1. A method of a communication device of decoding a first message; the first message and a second message being encoded by a code to produce a first code word and a second code word, respectively; wherein the code is represented as a state machine, wherein a state transition of the state machine has a previous state and a subsequent state and is associated with a corresponding segment of the code word, the method comprising:

receiving the first and second code words as distorted over a communication channel;

hypothesizing a plurality of differences between the first message and the second message, the differences being one or more symbols of the first message differing from corresponding symbols of the second message, wherein each hypothesized difference corresponds to a hypothesized value of a part of the first message;

selecting an initial code word segment having a plurality of initial states as associated previous states, wherein each of the initial states is associated with a corresponding one of the hypothesized differences and is uniquely defined by the respective hypothesized value of the part of the first message; and decoding the first message by, for each code word segment of the received first code word, starting with the initial code word segment:
- combining the code word segment of the received first code word with a transformed code word segment of the received second code word to produce a combined code word segment, wherein the code word segment of the received second code word is transformed based on the hypothesized difference of the initial state associated with the previous state of the state transition corresponding to a first message segment content;
- determining a decision metric associated with a probability that the combined code word segment corresponds to the first message segment content;
- selecting, for the first message, the first message segment content or a second message segment content based on the decision metric; and
- if the first message segment content is selected, associating the subsequent state of the state transition corresponding to the first message segment content with the initial state associated with the previous state of the state transition.

2. The method of claim 1, further comprising, if the second message segment content is selected, associating the subsequent state of the state transition corresponding to the second message segment content with the initial state associated with the previous state of the state transition corresponding to the second message segment content.

3. The method of claim 1, wherein combining the code word segment of the received first code word with a transformed code word segment of the received second code word comprises soft combining each symbol of the code word segment of the received first code word with a corresponding symbol of the transformed code word segment of the received second code word.

4. The method of claim 1, wherein the code word segment of the received second code word and the transformed code word segment of the received second code word differs by the hypothesized difference of the initial state associated with the previous state of the state transition corresponding to the first message segment content.

5. The method claim 1:
wherein a length of the part of the first message is larger than a length of a state of the state machine;
wherein the method further comprises:
- dividing the part of the first message into an initial state defining part and a state machine realization part, wherein a length of the initial state defining part equals the length of the state of the state machine;
- instantiating a plurality of state machine realizations wherein each of the state machine realizations is associated with a respective value of the state machine realization part;
- performing the hypothesizing, selecting and decoding steps for each of the plurality of state machine realizations;
wherein decoding the first message further comprises selecting one of the plurality of state machine realizations to define the decoded first message based on the decision metric of each of the plurality of state machine realizations.

6. The method of claim 1, further comprising decoding the second message by, for each code word segment of the received second code word, selecting, for the second message, the first message segment content or the second message segment content based on the decision metric.

7. The method of claim 1, further comprising decoding the second message by compensating the decoded first message for the hypothesized difference of the initial state associated with a final state corresponding to the decoded first message.

8. The method of claim 1, wherein the symbols are bits.

9. The method of claim 1, wherein the code belongs to at least one of the following code categories: tree codes, trellis codes, convolutional codes, turbo codes, and tail biting codes.

10. The method of claim 1, wherein the decoding applies at least one of the following decoding approaches: trellis decoding, sequential decoding, iterative decoding, Viterbi algorithm, Bahl-Cocke-Jelinek-Raviv algorithm, Fano algorithm, stack algorithm, creeper algorithm, turbo decoding, sliding window decoding, list decoding.

11. The method of claim 1, wherein the first and second messages are master information blocks; and wherein the first and second code words are received at different points in time.

12. The method of claim 1, wherein each of the hypothesized differences comprises different values of a counter.

13. The method of claim 1, wherein each of the hypothesized differences comprises different system frame numbers.

14. The method of claim 1, wherein each of the hypothesized differences comprises different cyclic redundancy check symbols resulting from different information symbols.

15. The method of claim 1:
wherein the first and second messages are master information blocks;
wherein the first and second code words are received at different points in time;
wherein each of the hypothesized differences corresponds to a hypothesized counter value of the first message and comprises:
- an increment of a counter representing different system frame numbers; and
- a difference of cyclic redundancy check—CRC—symbols resulting from the counter increment.

16. The method of claim 15:
wherein the hypothesized value of the part of the first message is the hypothesized counter value; and
wherein the increment is associated with the difference between the different points in time.

17. The method of claim 1,
wherein determining the decision metric comprises, for each state transition of the state machine, determining the decision metric as associated with a probability of the state transition conditional on the combined code word segment; and
wherein the decision metric is determined for each state transition of the state machine.

18. The method claim 17, wherein the decision metric is determined based on one of a Hamming distance and a Euclidean distance between the code word segment of the combined code word and a code word segment corresponding to the state transition.

19. The method of claim 15, wherein the decision metric is a log-likelihood ratio.

20. The method of claim 17, wherein the decision metric is determined by combining a branch metric of the state transition with a path metric of the previous state of the state transition.

21. A non-transitory computer readable recording medium storing a computer program product for controlling a communication device for decoding a first message; the first message and a second message being encoded by a code to produce a first code word and a second code word, respectively; wherein the code is represented as a state machine, wherein a state transition of the state machine has a previous state and a subsequent state and is associated with a corresponding segment of the code word, the computer program product comprising software instructions which, when run on processing circuitry of the communication device, causes the communication device to:
  receive the first and second code words as distorted over a communication channel;
  hypothesize a plurality of differences between the first message and the second message, the differences being one or more symbols of the first message differing from corresponding symbols of the second message, wherein each hypothesized difference corresponds to a hypothesized value of a part of the first message;
  select an initial code word segment having a plurality of initial states as associated previous states, wherein each of the initial states is associated with a corresponding one of the hypothesized differences and is uniquely defined by the respective hypothesized value of the part of the first message; and
  decode the first message by, for each code word segment of the received first code word, starting with the initial code word segment:
    combining the code word segment of the received first code word with a transformed code word segment of the received second code word to produce a combined code word segment, wherein the code word segment of the received second code word is transformed based on the hypothesized difference of the initial state associated with the previous state of the state transition corresponding to a first message segment content;
    determining a decision metric associated with a probability that the combined code word segment corresponds to the first message segment content;
    selecting, for the first message, the first message segment content or a second message segment content based on the decision metric; and
    if the first message segment content is selected, associating the subsequent state of the state transition corresponding to the first message segment content with the initial state associated with the previous state of the state transition.

22. A decoder for a communication device adapted to decode a first message; the first message and a second message being encoded by a code to produce a first code word and a second code word, respectively; wherein the code is represented as a state machine, wherein a state transition of the state machine has a previous state and a subsequent state and is associated with a corresponding segment of the code word; wherein the first and second code words are received as distorted over a communication channel, the decoder comprising:
  processing circuitry;
  memory containing instructions executable by the processing circuitry whereby the decoder is operative to:
    hypothesize a plurality of differences between the first message and the second message, the differences being one or more symbols of the first message differing from corresponding symbols of the second message, wherein each hypothesized difference corresponds to a hypothesized value of a part of the first message;
    select an initial code word segment having a plurality of initial states as associated previous states, wherein each of the initial states is associated with a corresponding one of the hypothesized differences and is uniquely defined by the respective hypothesized value of the part of the first message; and
    decode the first message by, for each code word segment of the received first code word, starting with the initial code word segment:
      combining the code word segment of the received first code word with a transformed code word segment of the received second code word to produce a combined code word segment, wherein the code word segment of the received second code word is transformed based on the hypothesized difference of the initial state associated with the previous state of the state transition corresponding to a first message segment content;
      determining a decision metric associated with a probability that the combined code word segment corresponds to the first message segment content;
      selecting, for the first message, the first message segment content or a second message segment content based on the decision metric; and
      if the first message segment content is selected, associating the subsequent state of the state transition corresponding to the first message segment content with the initial state associated with the previous state of the state transition.

23. The decoder of claim 22, wherein the instructions are such that the decoder is operative to, if the second message segment content is selected, associate the subsequent state of the state transition corresponding to the second message segment content with the initial state associated with the previous state of the state transition corresponding to the second message segment content.

24. The decoder of claim 22, wherein the instructions are such that the decoder is operative to combine the code word segment of the received first code word with a transformed code word segment of the received second code word by soft combining each symbol of the code word segment of the received first code word with a corresponding symbol of the transformed code word segment of the received second code word.

25. The decoder of claim 22, wherein the code word segment of the received second code word and the transformed code word segment of the received second code word differs by the hypothesized difference of the initial state associated with the previous state of the state transition corresponding to the first message segment content.

26. The decoder of claim 22:
  wherein a length of the part of the first message is larger than a length of a state of the state machine;
  wherein the instructions are such that the decoder is operative to:
    divide the part of the first message into an initial state defining part and a state machine realization part, wherein a length of the initial state defining part equals the length of the state of the state machine;
    instantiate a plurality of state machine realizations wherein each of the state machine realizations is associated with a respective value of the state machine realization part;

perform the hypothesizing, selecting, and decoding for each of the plurality of state machine realizations; and wherein decoding the first message comprises selecting one of the plurality of state machine realizations to define the decoded first message based on the decision metric of each of the plurality of state machine realizations.

27. The decoder of claim 22, wherein the instructions are such that the decoder is operative to decode the second message by, for each code word segment of the received second code word, selecting, for the second message, the first message segment content or the second message segment content based on the decision metric.

28. The decoder of claim 22, wherein the instructions are such that the decoder is operative to decode the second message by compensating the decoded first message for the hypothesized difference of the initial state associated with a final state corresponding to the decoded first message.

29. The decoder of claim 22, wherein the symbols are bits.

30. The decoder of claim 22, wherein the code belongs to at least one of the following code categories: tree codes, trellis codes, convolutional codes, turbo codes, and tail biting codes.

31. The decoder of claim 22, wherein the instructions are such that the decoder is operative to apply at least one of the following decoding approaches: trellis decoding, sequential decoding, iterative decoding, Viterbi algorithm, Bahl-Cocke-Jelinek-Raviv algorithm, Fano algorithm, stack algorithm, creeper algorithm, turbo decoding, sliding window decoding, list decoding.

32. The decoder of claim 22, wherein the first and second messages are master information blocks; and wherein the first and second code words are received at different points in time.

33. The decoder of claim 22, wherein each of the hypothesized differences comprises different values of a counter.

34. The decoder of claim 22, wherein each of the hypothesized differences comprises different system frame numbers.

35. The decoder of claim 22, wherein each of the hypothesized differences comprises different cyclic redundancy check symbols resulting from different information symbols.

36. The decoder of claim 22:
wherein the first and second messages are master information blocks;
wherein the first and second code words are received at different points in time; and
wherein each of the hypothesized differences corresponds to a hypothesized counter value of the first message and comprises:
an increment of a counter representing different system frame numbers; and
a difference of cyclic redundancy check—CRC—symbols resulting from the counter increment.

37. The decoder of claim 36:
wherein the hypothesized value of the part of the first message is the hypothesized counter value; and
wherein the increment is associated with the difference between the different points in time.

38. The decoder of claim 22, wherein the instructions are such that the decoder is operative to:
determine the decision metrics by, for each state transition of the state machine, determining the decision metric as associated with a probability of the state transition conditional on the combined code word segment; and
determine the decision metric for each state transition of the state machine.

39. The decoder of claim 38, wherein the instructions are such that the decoder is operative to determine the decision metric based on one of a Hamming distance and a Euclidean distance between the code word segment of the combined code word and a code word segment corresponding to the state transition.

40. The decoder of claim 39, wherein the decision metric is a log-likelihood ratio.

41. The decoder of claim 38, wherein the instructions are such that the decoder is operative to determine the decision metric by combining a branch metric of the state transition with a path metric of the previous state of the state transition.

42. A communication device, comprising:
a decoder, the decoder comprising processing circuitry and memory containing instructions executable by the processing circuitry whereby the decoder is operative to:
hypothesize a plurality of differences between the first message and the second message, the differences being one or more symbols of the first message differing from corresponding symbols of the second message, wherein each hypothesized difference corresponds to a hypothesized value of a part of the first message;
select an initial code word segment having a plurality of initial states as associated previous states, wherein each of the initial states is associated with a corresponding one of the hypothesized differences and is uniquely defined by the respective hypothesized value of the part of the first message; and
decode the first message by, for each code word segment of the received first code word, starting with the initial code word segment:
combining the code word segment of the received first code word with a transformed code word segment of the received second code word to produce a combined code word segment, wherein the code word segment of the received second code word is transformed based on the hypothesized difference of the initial state associated with the previous state of the state transition corresponding to a first message segment content;
determining a decision metric associated with a probability that the combined code word segment corresponds to the first message segment content;
selecting, for the first message, the first message segment content or a second message segment content based on the decision metric; and
if the first message segment content is selected, associating the subsequent state of the state transition corresponding to the first message segment content with the initial state associated with the previous state of the state transition.

* * * * *

UNITED STATES PATENT AND TRADEMARK OFFICE
CERTIFICATE OF CORRECTION

PATENT NO. : 10,291,260 B2  
APPLICATION NO. : 15/562289  
DATED : May 14, 2019  
INVENTOR(S) : Axmon et al.

Page 1 of 2

It is certified that error appears in the above-identified patent and that said Letters Patent is hereby corrected as shown below:

In the Drawings

In Fig. 6C, Sheet 6 of 12, for Step "630c", in Line 1, delete "assiciated" and insert -- associated --, therefor.

In Fig. 6C, Sheet 6 of 12, for Step "631c", in Line 1, delete "statesand" and insert -- states and --, therefor.

In the Specification

In Column 2, Line 5, delete "SB2:" and insert -- SIB2: --, therefor.

In Column 2, Line 16, delete "SB3:" and insert -- SIB3: --, therefor.

In Column 2, Line 28, delete "SB4:" and insert -- SIB4: --, therefor.

In Column 15, Line 10, delete "b119(1))]" and insert -- b119(1)] --, therefor.

In Column 15, Line 18, delete "C2(n)[b3n(2)" and insert -- C2(n)=[b3n(2) --, therefor.

In Column 15, Line 64, delete "0000100" and insert -- 00000100 --, therefor.

In Column 15, Lines 66-67, delete "{1 0 1 0 0 0 0 1 1 1 1 1 1 0 1 1 1 1 1 0 1 1 0 1 0 0 1 1 1 0}" and insert -- {1 0 1 0 0 0 0 1 1 1 1 1 1 0 1 1 0 1 0 0 1 1 1 0} --, therefor.

In Column 16, Line 2, delete "110}" and insert -- 1110} --, therefor.

In Column 23, Line 65, delete "NJ," and insert -- N1, --, therefor.

In Column 24, Line 7, delete "N=(or 65," and insert -- N1=(or 65, --, therefor.

Signed and Sealed this  
Fifteenth Day of October, 2019

Andrei Iancu  
*Director of the United States Patent and Trademark Office*

In Column 31, Line 40, delete "$S_k^{(m)}(n)\ T_i^{(m)}(n) \oplus S_i^{(0)}(n)$" and insert -- $S_k^{(m)}(n) = T_i^{(m)}(n) \oplus S_i^{(0)}(n)$ --, therefor In Column 34, Line 57, delete "where 10 repetition" and insert -- where repetition --, therefor.

In Column 35, Line 12, delete "value is 25" and insert -- value is --, therefor.

In Column 37, Line 44, delete "I-p" and insert -- 1-p --, therefor.

In Column 44, Line 6, delete "an, 4" and insert -- any 2 --, therefor.

In the Claims

In Column 51, Line 45, in Claim 5, delete "method claim" and insert -- method of claim --, therefor.

In Column 52, Line 55, in Claim 18, delete "method claim" and insert -- method of claim --, therefor.